United States Patent [19]
Endo et al.

[11] Patent Number: 6,118,851
[45] Date of Patent: *Sep. 12, 2000

[54] X-RAY IMAGE PICKUP DEVICE

[75] Inventors: Tadao Endo, Atsugi; Noriyuki Kaifu, Hachioji; Shinichi Takeda, Atsugi; Kazuaki Tashiro, Hadano; Isao Kobayashi, Atsugi; Toshio Kameshima, Sagamihara, all of Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 09/102,057

[22] Filed: Jun. 22, 1998

Related U.S. Application Data

[62] Division of application No. 08/725,319, Oct. 2, 1996, Pat. No. 5,801,385.

[30] Foreign Application Priority Data

Oct. 6, 1995 [JP] Japan .................................. 7-259625

[51] Int. Cl.[7] ...................................................... G21K 1/00
[52] U.S. Cl. .................. 378/98.8; 378/154; 250/370.09; 250/370.11
[58] Field of Search ................................... 378/98.8, 154, 378/155; 250/370.11, 370.09

[56] References Cited

U.S. PATENT DOCUMENTS

| | | | |
|---|---|---|---|
| 3,752,981 | 8/1973 | Jaszczak | 250/368 |
| 3,936,645 | 2/1976 | Iverson | 250/370.11 |
| 4,672,207 | 6/1987 | Derenzo | 250/363 |
| 4,864,594 | 9/1989 | Inbar et al. | 378/98.8 |
| 4,982,096 | 1/1991 | Fujii et al. | 250/367 |
| 5,303,282 | 4/1994 | Kwasnick et al. | 378/154 |
| 5,391,879 | 2/1995 | Tran et al. | 250/370.09 |
| 5,455,849 | 10/1995 | Logan et al. | 378/154 |
| 5,666,395 | 9/1997 | Tsukamoto et al. | 378/98.4 |

FOREIGN PATENT DOCUMENTS

| | | |
|---|---|---|
| 5-174747 | 7/1993 | Japan . |
| 7-50306 | 5/1995 | Japan . |
| 2016206 | 9/1979 | United Kingdom . |

*Primary Examiner*—Craig E. Church
*Attorney, Agent, or Firm*—Fitzpatrick, Cella, Harper & Scinto

[57] ABSTRACT

An X-ray image pickup device has a two-dimensional image reading device which is constituted by two-dimensionally forming a plurality of photoelectric conversion elements on an insulating substrate, and has switching elements in the vicinities of these photoelectric conversion elements, a phosphor which is formed on the two-dimensional image reading device and serves as a wavelength converter for converting X-ray radiation into visible light, and a grid plate which is formed on the phosphor and guides only X-rays from a specific direction toward the phosphor and the two-dimensional image reading device, whereby a next-generation X-ray image pickup device which can improve diagnostic efficiency that cannot be attained by the conventional film method, and has a high space factor and a high S/N ratio that cannot be attained by the CCD method can be provided.

23 Claims, 15 Drawing Sheets

200 (Pb)   201 (Al)

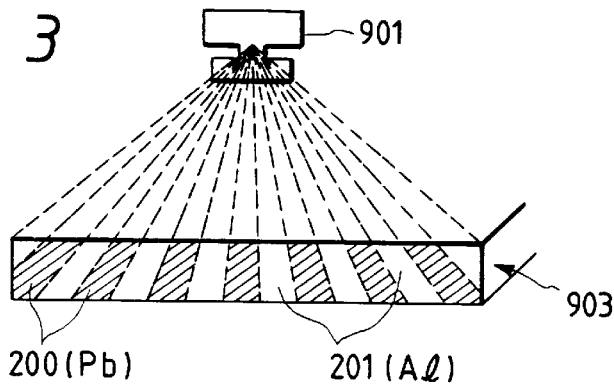
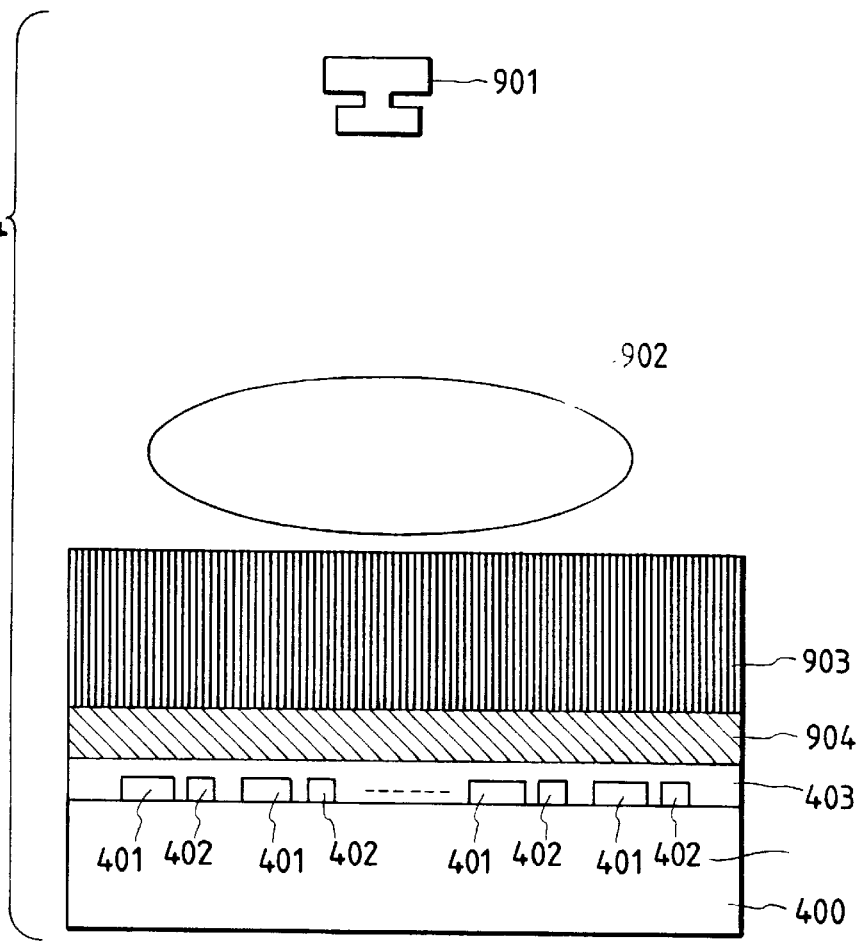

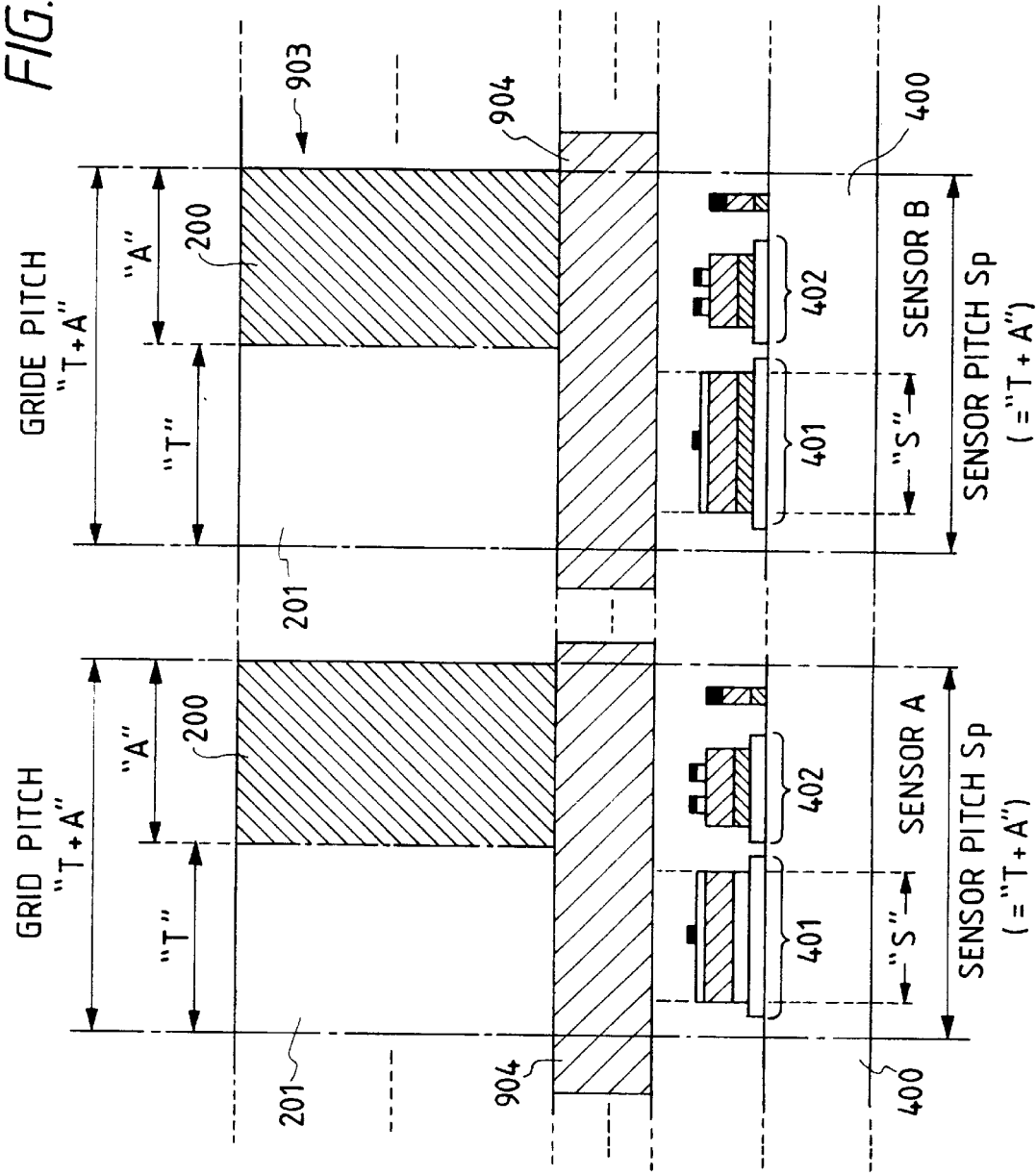

X-RAY IMAGE PICKUP DEVICE

This is a div. of Ser. No. 08/725,319 filed Oct. 2, 1996, now U.S. Pat. No. 5,801,385.

BACKGROUND OF THE INVENTION

1. Field of the Invention

The present invention relates to an X-ray image pickup device and, more particularly, to an X-ray image pickup device which has a large area and a high S/N ratio, and is applicable to a medical X-ray diagnostic apparatus.

2. Related Background Art

Nowadays, in an X-ray image pickup device is used medical diagnosis, which images the body by radiating X-rays onto a human body, capturing X-rays transmitted through the human body onto a phosphor that converts the X-rays into visible light, and exposing a film with the fluorescence (to be referred to as a film method hereinafter).

FIG. 1 shows the schematic arrangement of an X-ray diagnostic apparatus as a typical X-ray image pickup apparatus. Referring to FIG. 1, an X-ray source 901 radiates X-rays onto a patient, and the X-ray intensity and the radiation time are adjusted in correspondence with the purpose of diagnosis. In a human body (patient) 902, the radiated X-rays are scattered in every direction. For the purpose of increasing the resolution of an X-ray image, only X-rays in a specific direction are guided toward a phosphor (scintillator) 904 using a grid plate 903.

The scintillator 904 can generate fluorescence in a visible light region by recombination energy when the base material of the phosphor is excited (absorbed) and recombined by high-energy X-rays. The fluorescence is produced by the base material itself such as $CaWO_4$, $CdWO_4$, or the like, or by a luminescent center substance such as CsI:Tl or ZnS:Ag activated in the base material. Recently, phosphors using rare earth elements such as Tb, Eu, Pr, and the like as luminescent centers are used.

The grid plate is constituted by alternately arranging a substance (e.g., lead) that absorbs X-rays and a substance (e.g., aluminum) that transmits X-rays, and has the sectional arrangement shown in FIG. 2.

The fluorescence from the scintillator 904 exposes a film 905, and an X-ray image of the patient is obtained via a development process.

In another X-ray image pickup apparatus, a one- or two-dimensional CCD solid-state image pickup element is used in place of the film 905, so that the fluorescence from the scintillator 904 is imaged via a reduction optical system and the image is photoelectrically converted.

Not only in Japan in which the population of elderly people is increasing rapidly but also worldwide, improvement of diagnostic efficiency in hospitals and development of medical equipment with higher precision are strongly demanded. Under such circumstances, the conventional film type X-ray image pickup device has problems as described below.

Before a doctor acquires an X-ray image of a patient, a film development process must be performed, resulting in expenditure of much labor and time.

Sometimes, when a patient moves during X-ray image pickup or when the exposure amount is improper, image pickup must be inevitably redone. These factors inhibit improving the diagnostic efficiency in hospitals.

A clear X-ray image cannot often be obtained depending on the image pickup angle of the affected portion to be photographed. For this reason, in order to obtain an X-ray image required for diagnosis, some images must be taken while changing the image pickup angle. Such operation is not preferred especially when the patient is a baby or a pregnant woman.

Furthermore, X-ray image films must be preserved after image pickup for a certain period of time in hospitals, and the number of such films becomes very large in hospitals, resulting in poor efficiency in terms of management since the films must be pulled and replaced every time a patient comes to a hospital. When a patient needs to change the hospital he or she normally visits to seek medical attention for some reason; for example, when a patient in a remote place must undergo diagnosis as highly advanced as that he or she can receive only in a midtown university hospital or must move abroad, then X-ray films (after exposure and development) must be delivered to the next hospital by some method. Otherwise, the patient must be subjected to an image pickup operation again in the new hospital.

These problems are serious obstacles against establishing a new system of medical practice in future. It is the first object of the present invention to solve the above-mentioned problems.

In recent years, in medical industries, demand for "digitization of X-ray image information" is increasing. If the digitization is attained, X-ray image information can be managed using recording media such as magneto-optical disks, and a doctor can acquire X-ray image information at an optimal angle in real time. When a communication system such as a facsimile system, and the like are utilized, X-ray image information can be sent to hospitals everywhere in the world within a short period of time. Furthermore, when the obtained digital X-ray image information is subjected to image processing using a computer, diagnosis with higher precision than in the conventional method can be realized, and all the problems that the conventional film method has encountered can be solved.

Recently, an X-ray image pickup apparatus that uses a CCD solid-state image pickup element in place of a film has also been proposed.

However, existing CCD solid-state image pickup elements cannot be manufactured in a size that matches human bodies. When a CCD solid-state image pickup element is used, fluorescence, i.e., an X-ray image, from the scintillator must be imaged on the CCD light-receiving surface via a reduction optical system. It is difficult to attain an effective size reduction of the reduction optical system including the lenses which results in a large X-ray image pickup apparatus.

Since an X-ray image is formed via a lens, light components that do not enter the lens are wasted. Therefore, light components entering a lens are reduced to $1/100$ to $1/1,000$ although such ratio depends on the reduction ratio, and it is generally accepted that the S/N (signal to noise) ratio is reduced to $1/10$ to $1/100$ upon passing through the lens. This fact is expected to be disadvantageous upon applying the CCD solid-state image pickup element to medical equipments that require high gradation characteristics.

SUMMARY OF THE INVENTION

As described above, it is an object of the present invention to provide a next-generation X-ray image pickup device with an improved diagnostic efficiency, which can not be attained by conventional film methods, and can guarantee a high space factor and a high S/N ratio that cannot be attained by the CCD method.

It is another object of the present invention to provide an X-ray image pickup device which can obviate the need for any reduction lens system including a lens, and can thus provide a size reduction.

It is still another object of the present invention to provide an X-ray image pickup device which can efficiently read light converted by a phosphor.

It is still another object of the present invention to provide an X-ray image pickup device which can remove scattered X-ray components, and can obtain a high-quality X-ray image with a high S/N ratio and high resolution.

It is still another object of the present invention to provide an X-ray image pickup device which is resists errors due to vibrations and has high reliability.

It is still another object of the present invention to provide a high-precision X-ray image pickup device which can obtain data that can be used in data communications.

It is still another object of the present invention to provide an X-ray image pickup device which can be used as an I/O device of a medical X-ray diagnostic apparatus.

It is still another object of the present invention to provide an X-ray image pickup device comprising a two-dimensional image reading device constituted by two-dimensionally forming a plurality of photoelectric conversion elements on an insulating substrate, a wavelength converter which is formed to be in substantially tight contact with a surface of the two-dimensional image reading device and converts a wavelength of irradiated X-rays into a wavelength in a photosensitive wavelength range of the two-dimensional image reading device, and a grid plate which is formed between the wavelength converter and an X-ray source, and guides only X-rays from a specific direction to the wavelength converter.

It is still another object of the present invention to provide an X-ray image pickup device wherein in the above X-ray image pickup device, the two-dimensional image reading device is constituted by arranging the photoelectric conversion elements each serving as a pixel at a predetermined interval (sensor pitch) in X- and Y-directions, the grid plate is constituted by pairs of substance portions (A) that absorb X-rays and substance portions (B) that transmit X-rays at a predetermined interval (grid pitch) in at least one of the X- and Y-directions, and a size, in a direction of the grid pitch, of a light-receiving surface of the photoelectric conversion element is equal to a pitch of the grid plate or a value N times (N: an integer equal to or larger than 2) of the pitch of the grid plate.

It is still another object of the present invention to provide an X-ray image pickup device wherein in the above X-ray image pickup device, the two-dimensional image reading device is constituted by arranging the photoelectric conversion elements each serving as a pixel at a predetermined interval (sensor pitch) in X- and Y-directions, the grid plate is constituted by pairs of substance portions (A) that absorb X-rays and substance portions (B) that transmit X-rays at a predetermined interval (grid pitch) in at least one of the X- and Y-directions, and the sensor pitch is set to be equal to the grid pitch or a value N times (N: an integer equal to or larger than 2) of the grid pitch.

It is still another object of the present invention to provide an X-ray image pickup device wherein in the above X-ray image pickup device, a positional relationship between the two-dimensional image reading device and the grid plate is determined to maximize a signal output from the photoelectric conversion element.

It is still another object of the present invention to provide an X-ray image pickup device wherein in the above X-ray image pickup device, the photoelectric conversion element is constituted by, from the insulating substrate side, a first metal thin film layer serving as a lower electrode, an amorphous silicon nitride insulating layer (a-SiN$_x$) for blocking passage of electrons and holes, a hydrogenated amorphous silicon photoelectric conversion layer (a-Si:H), an n-type injection blocking layer for blocking injection of hole carriers or a p-type injection blocking layer for blocking injection of electron carriers, and a transparent conductive layer or a second metal thin film layer formed on a portion of the injection blocking layer, which serves as an upper electrode.

Since an X-ray image pickup device of the present invention comprises a two-dimensional image reading device which is constituted by two-dimensionally forming a plurality of photoelectric conversion elements on an insulating substrate, a wavelength converter which is in tight contact with the surface of the two-dimensional image reading device and converts the wavelength of irradiated X-rays into that in a photosensitive wavelength range of the reading device, and a grid plate which is arranged between the wavelength converter and an X-ray source to guide only X-rays from a specific direction to the wavelength converter, a high-quality X-ray image can be obtained without using any film, and data processing is facilitated.

Since the necessity of any reduction optical system including a lens can be obviated, the entire X-ray image pickup device can be reduced in size.

Furthermore, since most of light components from a phosphor can be effectively used, an X-ray image pickup device with a high S/N ratio can be provided.

With this device, not only the diagnostic efficiency in hospitals can be greatly improved, but also a diagnostic information network can be constructed to cover the entire nation. Hence, a patient even in a remote place can undergo medical diagnosis as highly advanced as that in a midtown hospital. Therefore, the diagnostic efficiency in the entire medical field can be improved.

Since the grid plate is specifically arranged, scattered X-rays in a human body can be removed.

In the two-dimensional image reading device that constitutes the X-ray image pickup device of the present invention, the photoelectric conversion elements each serving as a pixel are disposed in the X- and Y-directions at predetermined intervals (sensor pitches), the grid plate is constituted by disposing pairs of substances (A) that absorb X-rays and substances (B) that transmit X-rays at predetermined intervals (grid pitches) in at least one of the X- and Y-directions, and the size, in the grid pitch direction, of the light-receiving surface of the photoelectric conversion element is equal to the pitch of the grid plate or is equal to a value N times (N: an integer equal to or larger than 2) of the pitch of the grid plate. With this arrangement, an X-ray image pickup device which is free from any moire and has high reliability and high resolution can be provided.

Alternatively, the two-dimensional image reading device that constitutes the X-ray image pickup device of the present invention may be arranged as follows. That is, the photoelectric conversion elements each serving as a pixel are disposed in the X- and Y-directions at predetermined intervals (sensor pitches), the grid plate is constituted by disposing pairs of substances (A) that absorb X-rays and substances (B) that transmit X-rays at predetermined intervals (grid pitches) in at least one of the X- and Y-directions, and the sensor pitch is equal to the grid pitch or a value N times (N: an integer equal to or larger 2) of the grid pitch, thereby preventing generation of any moire. Furthermore, when the positional relationship between the two-dimensional image reading device and the grid plate is determined to maximize the signal output from the photoelectric conversion element, the X-ray image pickup device can have a high S/N ratio.

The photoelectric conversion element is constituted by, from the side of the insulating substrate, a first metal thin film layer serving as a lower electrode, an amorphous silicon nitride insulating layer (a-SiN$_x$) that blocks passage of electrons and holes, a hydrogenated amorphous silicon photoelectric conversion layer (a-Si:H), an n-type injection blocking layer for blocking injection of hole carriers or a p-type injection blocking layer for blocking injection of electron carriers, and a transparent conductive layer or a second metal thin film layer formed on a portion of the injection blocking layer, which layer serves as an upper electrode. With this structure, an existing thin film manufacturing device such as a CVD device, a sputtering device, or the like can be easily used, and the image pickup portion of the X-ray image pickup device can be manufactured to have a large area and low cost. When the grid and an X-ray-visible light conversion phosphor having the same size as that of the photoelectric conversion device portion are used, a low-profile, compact, and high-S/N-ratio X-ray image pickup device can be provided. X-ray image data obtained by this device can be easily combined with digital techniques, thus greatly improving diagnostic efficiency in the entire medical field in future.

BRIEF DESCRIPTION OF THE DRAWINGS

FIGS. 2 and 3 are sectional views for explaining an example of a grid;

FIG. 4 is a sectional view for explaining an example of the overall arrangement of an X-ray image pickup apparatus according to the present invention;

FIGS. 14, 15, 17, and 18 are sectional views for explaining preferred embodiments of an X-ray image pickup device of the present invention.

DETAILED DESCRIPTION OF THE PREFERRED EMBODIMENTS

The present invention will be described in detail hereinafter with reference to the accompanying drawings.

FIG. 4 is a schematic sectional view showing the overall arrangement of an X-ray image pickup apparatus having a preferred X-ray image pickup device of the present invention. Referring to FIG. 4, X-rays from an X-ray source 901 are irradiated onto a human body 902, and are subjected to absorption, transmission, and scattering depending on substances in the body such as the lungs, bones, blood vessels, a focus, and the like. The X-rays that have traversed the human body travel toward a grid 903.

Figure 1:
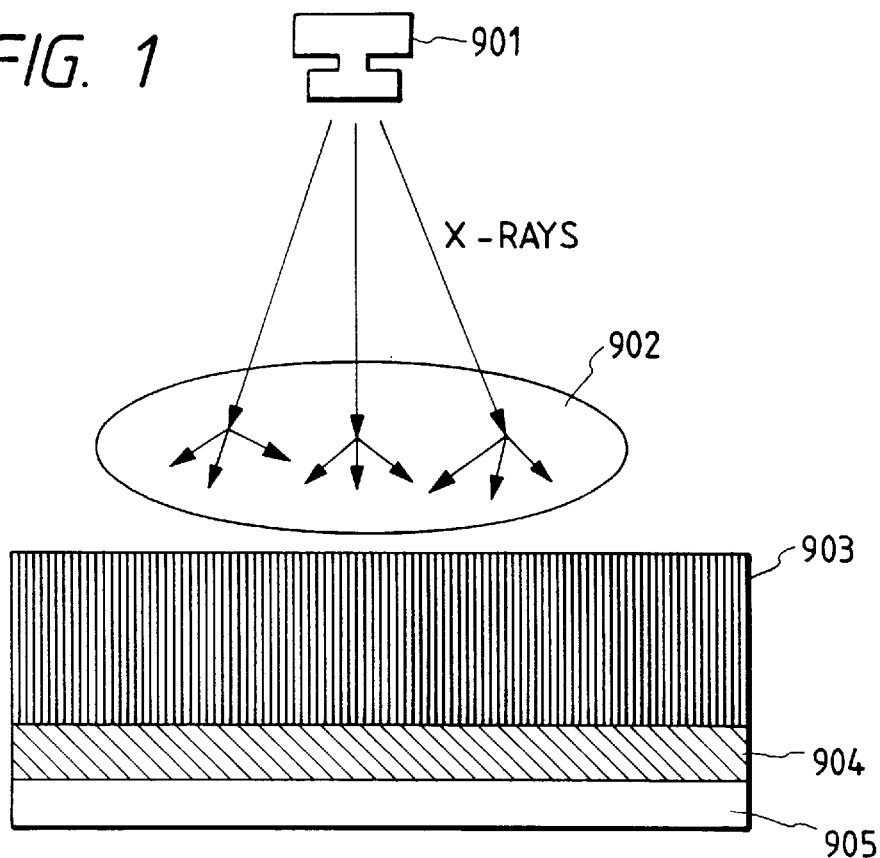
FIG. 1 is a schematic sectional view for explaining an example of a conventional X-ray image pickup apparatus.
Figure 2:
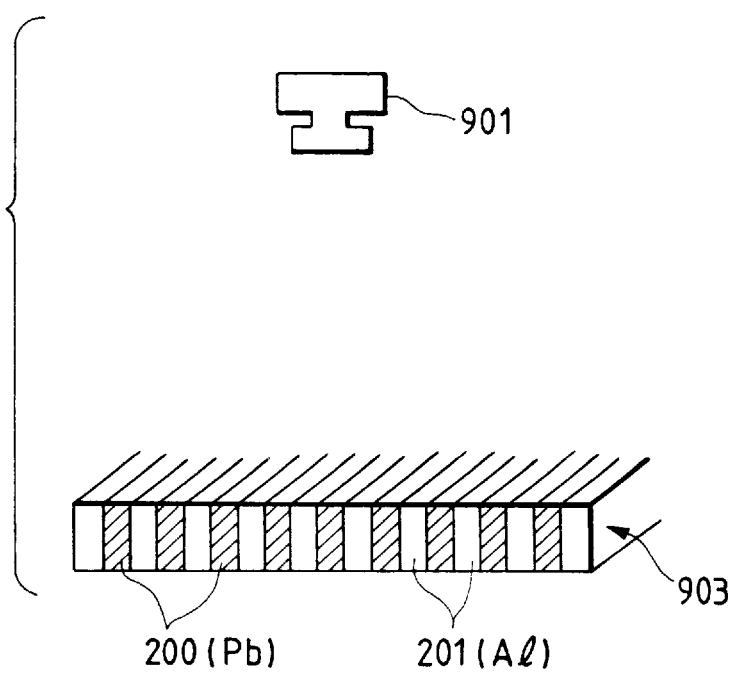

FIGS. 2 and 3 are sectional views showing the arrangement of the grid. The grid is constituted by alternately arranging a substance 200 (e.g., lead) that absorbs X-rays, and a substance 201 (e.g., aluminum) that transmits X-rays. The reason why the grid is arranged is to prevent a decrease in resolution due to X-rays scattered inside the human body. More specifically, only X-rays in a specific direction (the sectional direction of the grid) pass through the X-ray transmission substance portions 201, and reach a scintillator (phosphor) 904. On the other hand, X-rays scattered inside the human body are absorbed by the absorption substance portions 200 of the grid, and cannot reach the scintillator.

The X-rays irradiated onto the scintillator are excited (absorbed) by a fluorescent substance in the scintillator, and the scintillator produces fluorescence close to or including the spectral sensitivity wavelength range of photoelectric conversion elements 401.

The photoelectric conversion elements 401, which are in tight contact with the phosphor, photoelectrically convert corresponding fluorescence components of an X-ray image from the scintillator 904 into signal charges, which are transferred to processing circuits (an amplifier, an A/D converter, and the like; not shown in FIG. 4) via switching elements 402.

Note that the phosphor need not be perfectly in tight contact with the photoelectric conversion elements, but need only be substantially in tight contact with them. The phrase "substantially in tight contact with" means that the phosphor is disposed with a gap to the element, that is, sufficiently smaller than the sensor pitch. With this arrangement, light can be fully utilized, and the image can be prevented from being blurred.

The photoelectric conversion elements 401 and switching elements 402 are formed on an insulating substrate 400, and a protection film 403 covers these elements to protect them.

FIGS. 2 and 3 show the section of the grid shown in FIG. 4. FIG. 2 shows a grid which is used when the distance to the X-ray source is relatively large, and in which the X-ray absorption substance portions (Pb) and X-ray transmission substance portions (Al) are disposed parallel to each other. On the other hand, in a grid shown in FIG. 3, X-ray absorption substance portions (Pb) and X-ray transmission substance portions (Al) are inclined to point in the direction of the X-ray source 901 in its sectional structure, and such grid is used when the distance between the X-ray source and the grid is relatively small. Such structure is advantageous in terms of space in the X-ray image pickup device. In the case of the grid shown in FIG. 3, since X-rays that directly pass through the human body without being absorbed or scattered are directly irradiated onto the scintillator, brighter fluorescence can be obtained, and a high S/N ratio is assured.

Figure 5:
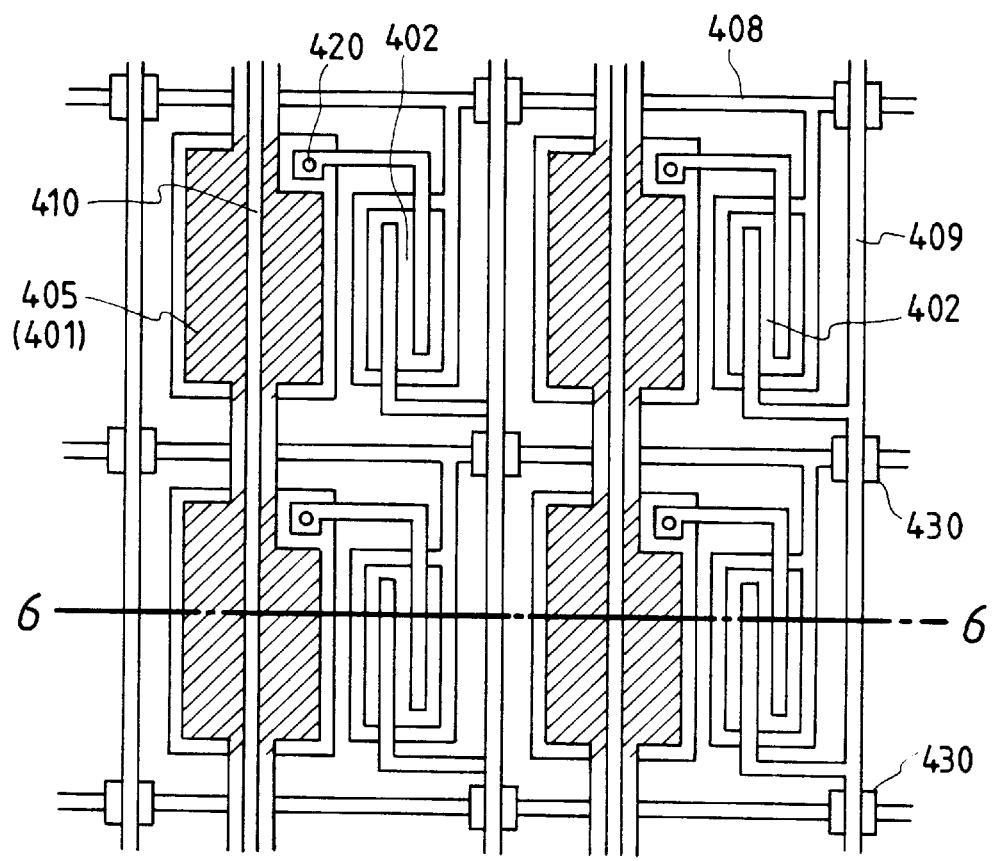
FIG. 5 is a plan view for explaining a photoelectric conversion portion that can be used in an X-ray image pickup device according to the present invention.

FIG. 5 is a plan view showing the photoelectric conversion elements and the switching elements for four pixels of a two-dimensional photoelectric conversion device portion that can be preferably used in the X-ray image pickup device of the present invention. In FIG. 5, hatched portions 405 correspond to light-receiving surfaces which receive fluorescence from the scintillator. The switching elements 402 transfer signal charges photoelectrically converted by the photoelectric conversion elements toward the processing circuits via signal lines 409 connected to the processing circuits, and are controlled via control lines 408. Power supply lines 410 supply a bias voltage to the photoelectric conversion elements. Contact holes 420 connect the photoelectric conversion elements 401 and the switching elements 402.

Figure 6:
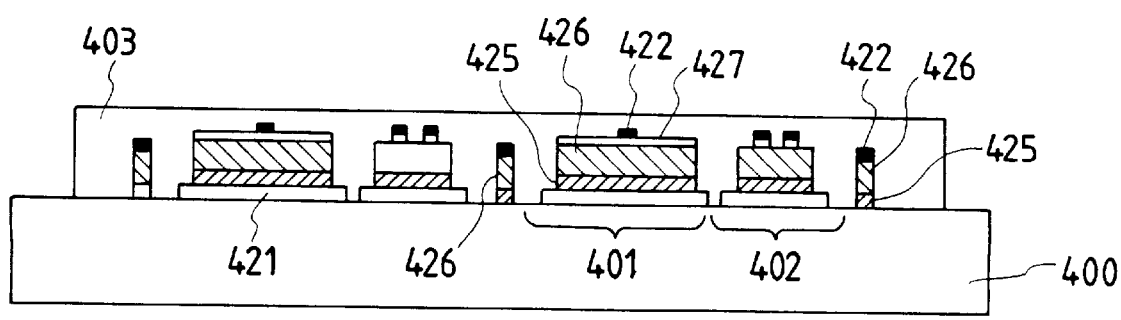
FIG. 6 is a sectional view showing the photoelectric conversion portion shown in FIG. 5.

FIG. 6 is a sectional view showing the photoelectric conversion device portion taken along a direction 6—6 in FIG. 5. An example of the method of forming the photoelectric conversion device portion that can be used in the present invention will be explained below.

A chromium (Cr) film having a thickness of about 500 Å is deposited on the insulating substrate 400 by a sputtering method or a resistive heating method and is patterned by a photolithography process to etch unnecessary areas, thereby forming a first metal thin film layer 421. The first metal thin film layer 421 serves as the lower electrode of each photoelectric conversion element 401 and the gate electrode of each switching element 402.

A 2,000-Å thick a-SiN$_x$ layer (425), a 5,000-Å thick a-Si:H layer (426), and a 500-Å thick n$^+$-layer (427) are stacked in turn by a CVD method in an identical vacuum atmosphere. These layers respectively serve as the insulating layer/photoelectric conversion semiconductor layer/hole injection blocking layer of each photoelectric conversion element 401, and also serve as the gate insulating film/semiconductor layer/ohmic contact layer of each switching element 402. These layers are also used as insulating members for cross portions (430 in FIG. 5) between the first metal thin film layer 421 and a second metal thin film layer 422. The thicknesses of these layers are not limited to the above-mentioned values, but may be optimally designed in correspondence with the voltages and charges to be used in the photoelectric conversion device, the incident fluorescence amount from the scintillator, and the like. At least the a-SiN$_x$ layer preferably has a thickness of 500 Å or more, which can prevent passage of electrons and holes and can sufficiently assure the function of the gate insulating film of a TFT.

After these layers are stacked, areas that serve as contact holes (see 420 in FIG. 5) are dry-etched by RIE (Reactive Ion Etching), CDE (Chemical Dry Etching), or the like, and thereafter, an aluminum (Al) film having a thickness of about 10,000 Å is deposited as a second metal thin film layer 422 by a sputtering method or a resistive heating method. The deposited film is patterned by a photolithography technique to etch unnecessary areas.

The second metal thin film layer serves as the upper electrode of each photoelectric conversion element 401, the source and drain electrodes of each switching element (TFT), other wiring lines (interconnects), and the like. When the second metal thin film layer 422 is formed, the upper and lower thin film layers are connected via the contact hole portions at the same time.

Furthermore, in order to form a channel portion of each TFT, a portion between the source and drain electrodes is etched by an RIE method, and thereafter, unnecessary portions of the a-SiN$_x$ layer, a-Si:H layer, and n$^+$-layer are etched to isolate the respective elements. In this manner, the photoelectric conversion elements 401, the switching TFTs 402, other wiring lines (408, 409, 410), and the contact holes 420 are formed.

The sectional view in FIG. 6 illustrates the elements for only two pixels, but a large number of pixels are simultaneously formed on the insulating substrate 400, needless to say. Finally, for the purpose of improving humidity resistance, an SiN$_x$ passivation film (protection film) are coated on the elements and wiring lines.

As described above, the photoelectric conversion elements, the switching TFTs, and the wiring lines are formed by only simultaneously forming the first metal thin film layer, a-SiN$_x$ layer, a-Si:H layer, n$^+$-layer, and second metal thin film layer, and etching these layers. There is only one injection block layer in each photoelectric conversion element, and the above layers are formed in an identical vacuum atmosphere.

An example of the device operation of the photoelectric conversion element 401 alone that can be used in the present invention will be explained below.

Figure 7A:
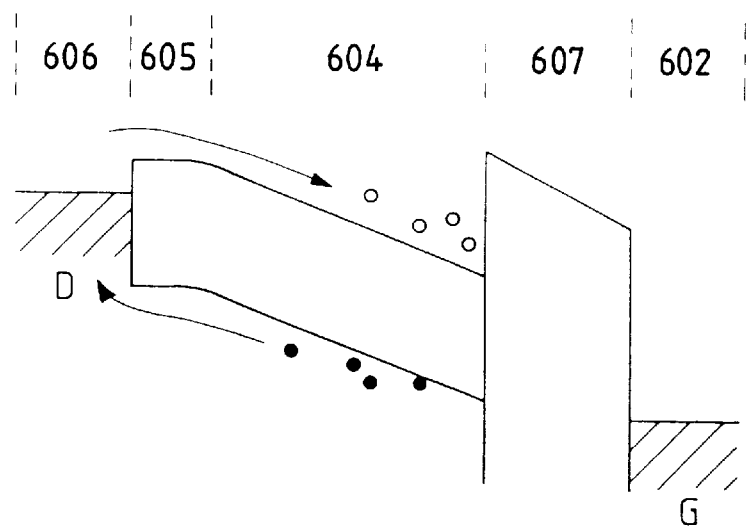
FIGS. 7A to 7C are schematic energy band diagrams for explaining an example of the operation of a photoelectric conversion element that can be used in the present invention.
Figure 7B:
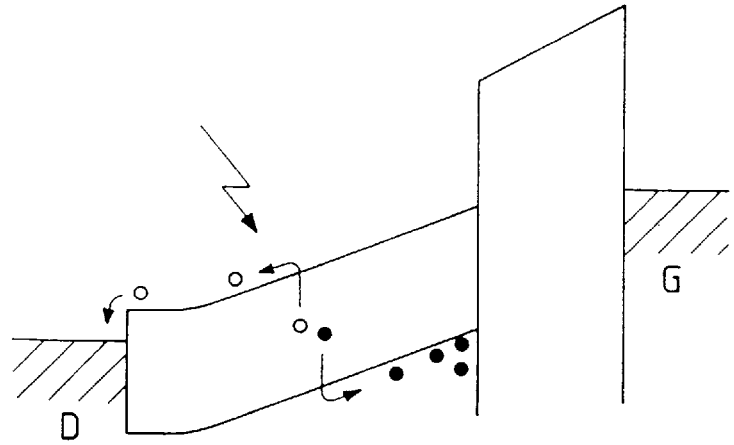

FIGS. 7A and 7B are energy band diagrams respectively showing the refresh mode and the photoelectric conversion mode of the photoelectric conversion element, and each show the state in the direction of thickness of the respective layers in FIG. 6. In FIG. 7A, a lower electrode 602 (to be referred to as a G electrode hereinafter) consists of Cr. An insulating layer 607 consists of SiN and blocks passage of both electrons and holes. The thickness of the layer 607 is set to be 500 Å or more that can prevent movement of electrons and holes due to the tunnel effect. A photoelectric conversion semiconductor layer 604 consists of an intrinsic (i-type) semiconductor layer of hydrogenated amorphous silicon (a-Si). An injection blocking layer 605 of an n-type a-Si layer blocks injection of holes into the photoelectric conversion semiconductor layer 604. An upper electrode 606 (to be referred to as a D electrode hereinafter) consists of Al.

In this embodiment, although the D electrode does not perfectly cover the n-layer, the D electrode and the n-layer always have the same potential to allow free movement of electrons between the D electrode and the n-layer, and the following description will be made under the assumption of this fact. The photoelectric conversion element of this embodiment performs two different operations, i.e., the refresh mode and the photoelectric conversion mode depending on the way of applying a voltage between the D and G electrodes.

In FIG. 7A that shows the refresh mode, the D electrode is applied with a negative potential with respect to the G electrode, and holes indicated by full circles in the i-layer 604 are guided by an electric field toward the D electrode. At the same time, electrons indicated by open circles are injected into the i-layer. At this time, some holes and electrons recombine in the n-layer 605 and the i-layer 604 and disappear. If this state continues for a sufficiently long period of time, holes in the i-layer 604 are wiped out from the i-layer 604.

In order to switch this state to the photoelectric conversion mode shown in FIG. 7B, a positive potential is applied to the D electrode with respect to the G electrode. Upon applying this voltage, electrons in the i-layer 604 are instantaneously guided to the D electrode. However, since the n-layer 605 serves as an injection blocking layer, holes are never guided to the i-layer 604. In this state, when light enters the i-layer 604, light is absorbed to generate electron-hole pairs. These electrons are guided to the D electrode, and the holes move inside the i-layer 604 and reach the interface between the i-layer 604 and the insulating layer 607. However, since holes cannot move into the insulating layer 607, they stay in the i-layer 604. At this time, since the electrons move into the D electrode, and the holes move to the interface with the insulating layer 607 in the i-layer 604, a current flows from the G electrode to maintain an electrically neutral state. Since this current is proportional to the electron-hole pairs produced by light, it is proportional to incident light. After the photoelectric conversion mode (FIG. 7B) is maintained for a predetermined period, when the element is switched to the refresh mode state (FIG. 7B), holes staying in the i-layer 604 are guided to the D electrode, as described above, and a current corresponding to these holes flows concurrently. The amount of holes corresponds to the total amount of light that is incident during the photoelectric conversion mode period. At this time, a current that corresponds to the amount of electrons injected into the i-layer 604 also flows. However, the amount of electrons is nearly constant, and can be subtracted from the amount of holes to detect the light amount. That is, the photoelectric conversion element of this embodiment can output the amount of incident light in real time, and at the same time, can output the total amount of light that enters the element for a predetermined period.

However, when the photoelectric conversion period is prolonged for some reason or when incident light has a strong illuminance, often no current flows although light becomes incident. Such phenomenon occurs for the following reason. That is, a large number of holes stay in the i-layer 604, these holes reduce the electric field in the i-layer 604, and produced electrons are not guided to the D electrode by the electric field but recombine with holes in the i-layer 604. When the incident state of light changes in this state, a current flows unstably, but when the refresh mode is set again, holes in the i-layer 604 are wiped out, and a current proportional to light can be obtained in the next photoelectric conversion mode.

Figure 7C:
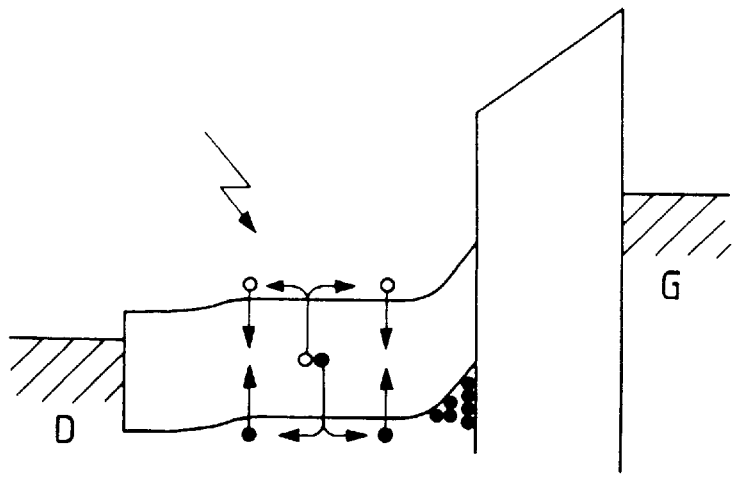

In the above description, when holes in the i-layer 604 are wiped out in the refresh mode, it is ideal to wipe out all the holes, but it is effective to wipe out only some holes. In this case, a current equal to that obtained in the above case can be obtained, and no serious problem is posed. That is, the state shown in FIG. 7C need only be prevented at the detection timing in the next photoelectric conversion mode, and the potential of the D electrode with respect to the G electrode in the refresh mode, the duration of the refresh mode, and the characteristics of the injection blocking layer of the n-type layer 605 need only be determined. Furthermore, in the refresh mode, injection of electrons into the i-layer 604 is not a necessary condition, and the potential of the D electrode with respect to the G electrode is not limited to a negative potential for the following reason. That is, when a large number of holes stay in the i-layer 604, even when the potential of the D electrode with respect to the G electrode is a positive potential, the electric field in the i-layer acts in a direction to guide the holes to the D electrode. It is not a necessary condition for the characteristics of the injection blocking layer of the n-layer 605, either, that it be capable of injecting electrons into the i-layer 604.

Figure 8:
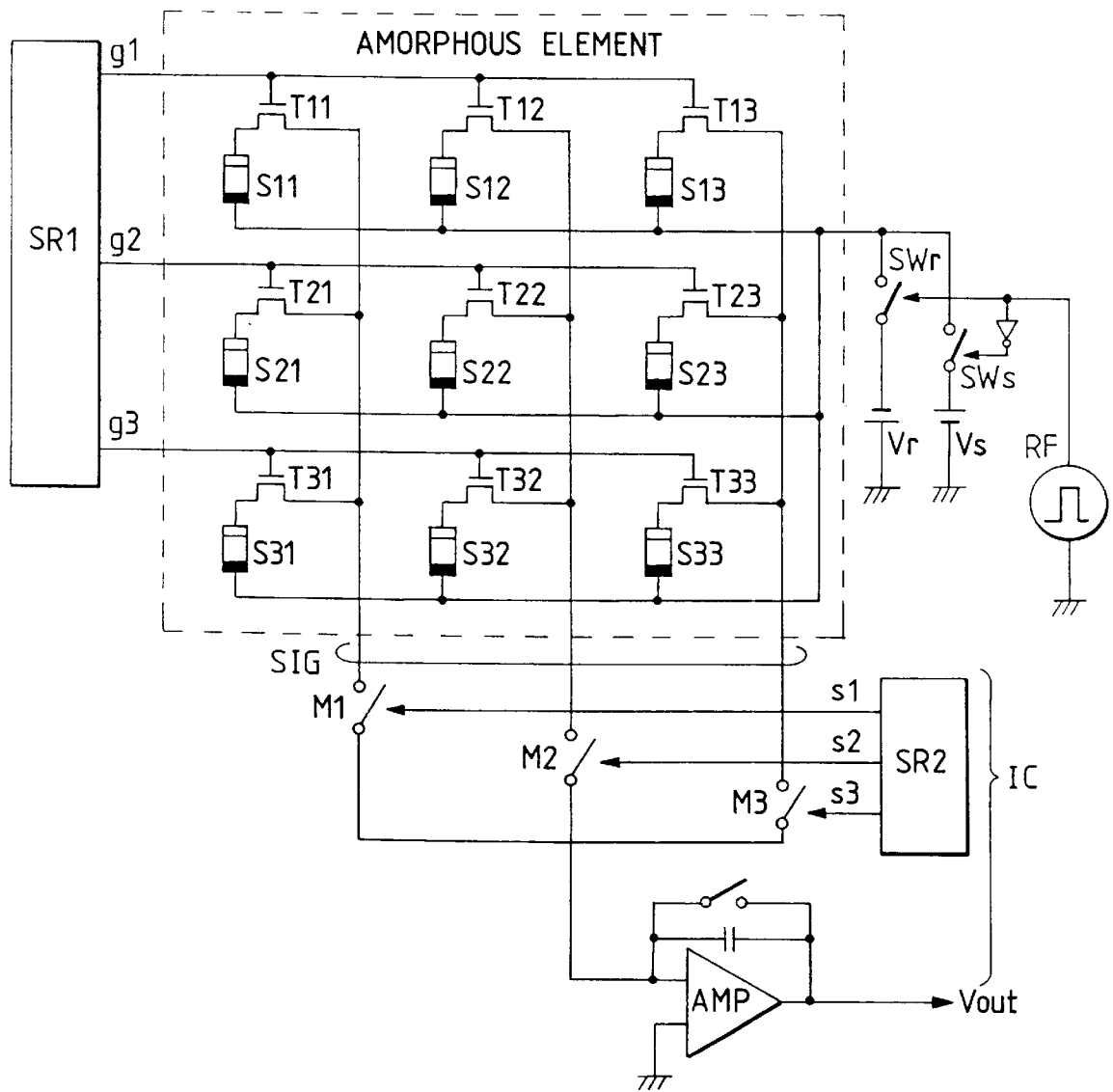
FIG. 8 is a schematic equivalent circuit diagram showing an example of a photoelectric conversion portion that can be used in the present invention.
Figure 9:
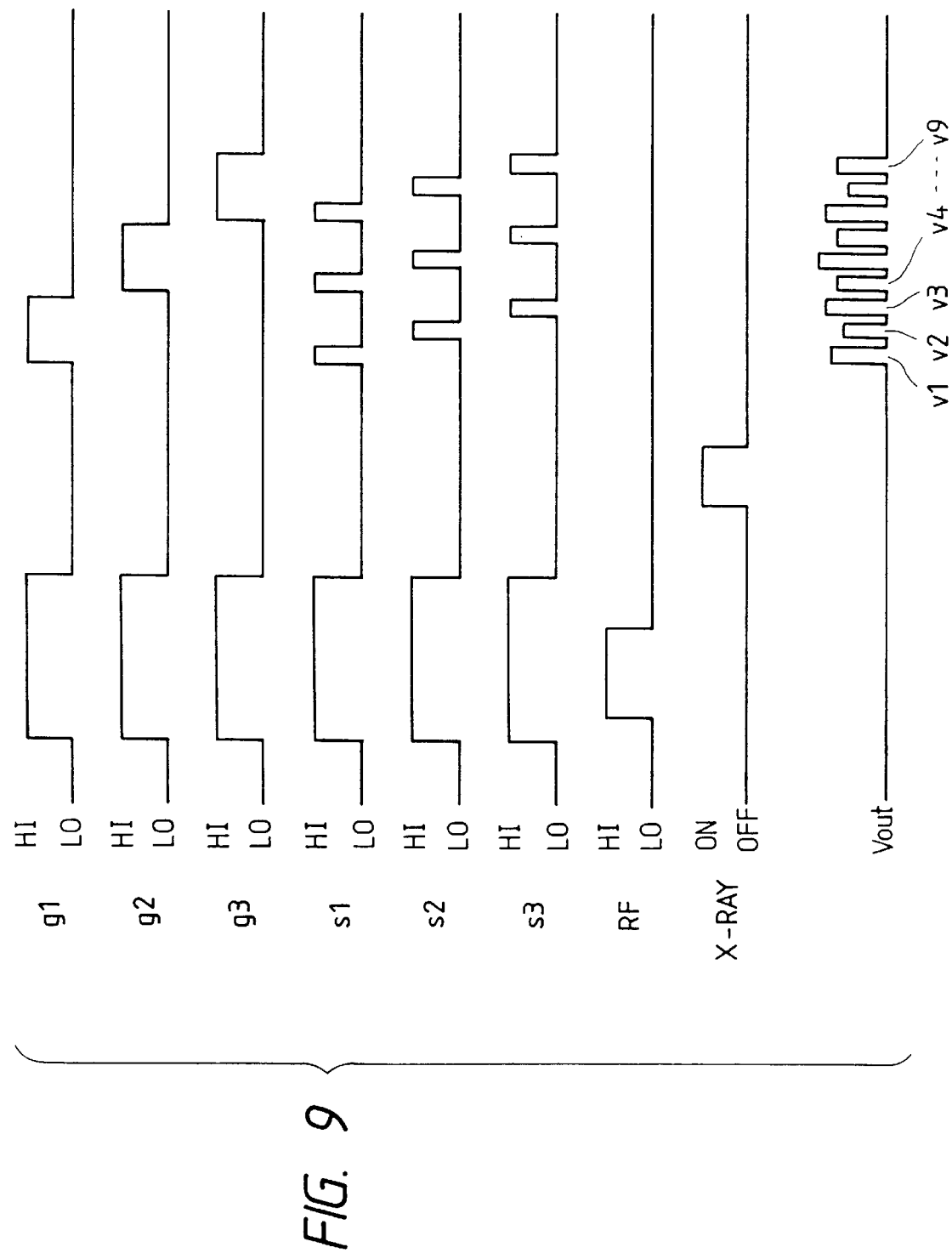
FIG. 9 is a timing chart for explaining an example of the drive timing of the photoelectric conversion portion that can be used in the present invention.

The photoelectric conversion operation when the photoelectric conversion elements shown in FIGS. 5 and 6 are two-dimensionally arranged will be described below. FIG. 8 is an equivalent circuit diagram showing an example of the photoelectric conversion device obtained by two-dimensionally arranging the photoelectric conversion elements, and FIG. 9 is a timing chart showing an example of the operation of this device.

Referring to FIG. 8, photoelectric conversion elements S11 to S33, the lower electrode side of which is indicated by G and the upper electrode side of which is indicated by D, are connected to switching TFTs T11 to T33. A reading power supply Vs and a refresh power supply Vr are respectively connected to the D electrodes of all the photoelectric conversion elements S11 to S33 via switches SWs and SWr. The switch SWs is connected to a refresh control circuit RF via an inverter, and the switch SWr is directly connected to the circuit RF. The refresh control circuit RF controls these switches so that the switch SWr is turned on during the refresh period and the switch SWs is turned on during other periods. One pixel is constituted by one photoelectric conversion element and one switching TFT, and its signal output is connected to a detection integrated circuit IC via a signal line SIG. In this photoelectric conversion device, a total of nine pixels are divided into three blocks. The outputs from three pixels per block are simultaneously transferred, and are sequentially converted into outputs by the detection integrated circuit IC via the signal lines SIG, thus obtaining outputs (Vout). Three pixels in one block are arranged in the horizontal direction, and the three blocks are arranged in the vertical direction, thus arranging pixels two-dimensionally.

Figure 10:
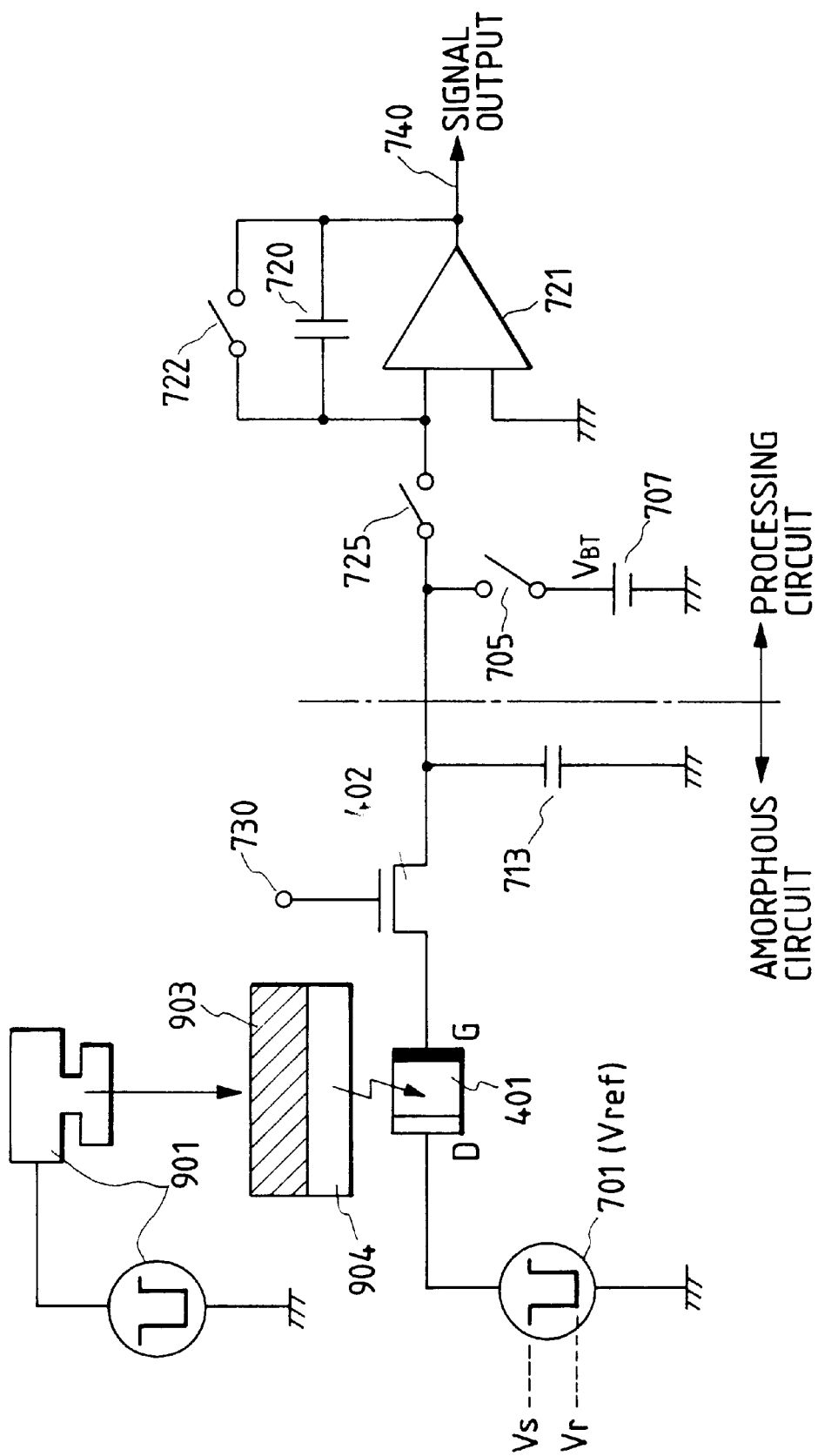
FIG. 10 is a schematic equivalent circuit diagram for one pixel of the photoelectric conversion portion that can be used in the present invention.
Figure 11:
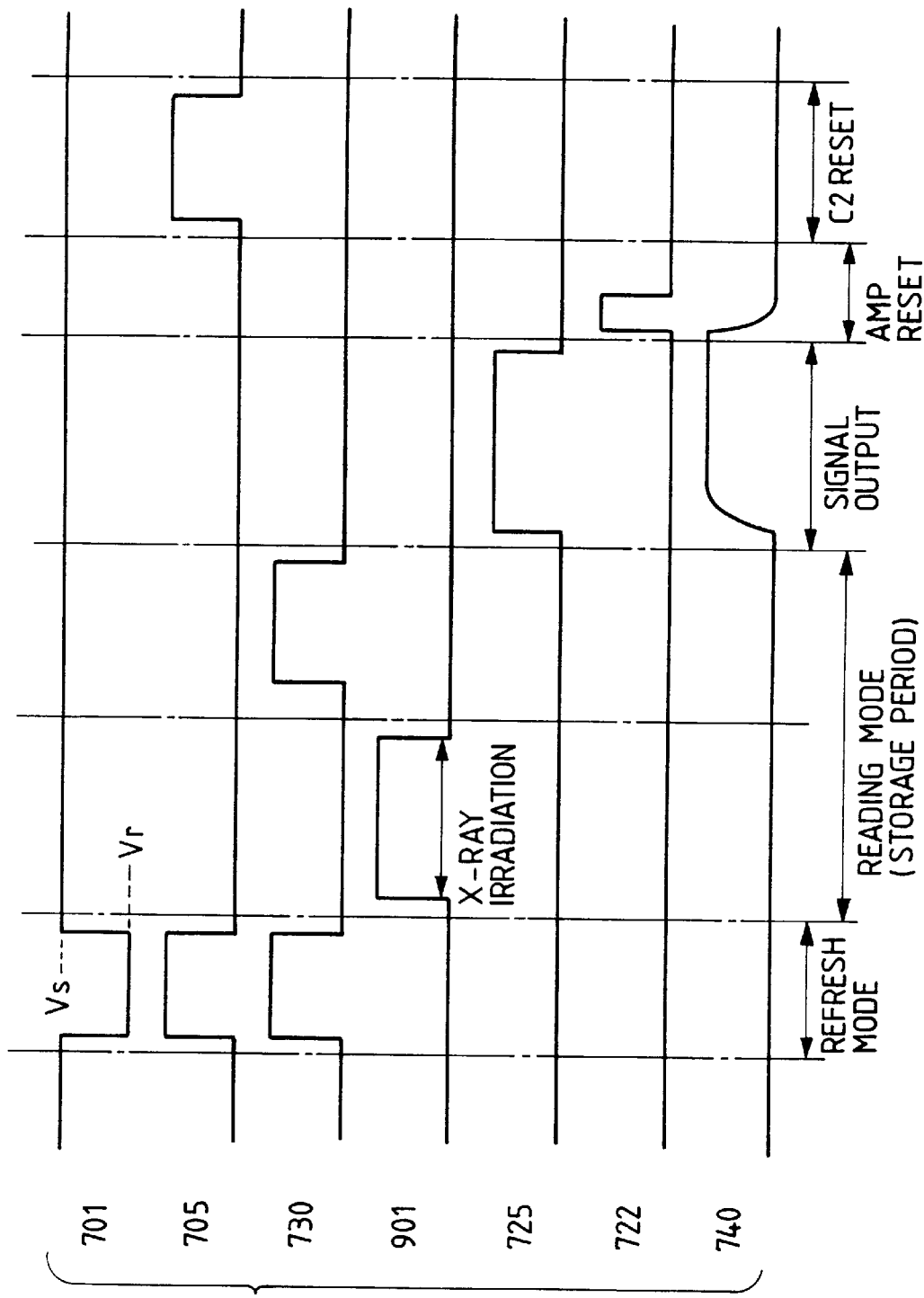
FIG. 11 is a schematic timing chart of the photoelectric conversion portion shown in FIG. 10.

An example of the operation of one pixel in the photoelectric conversion portion in the X-ray image pickup device of the present invention will be explained below with reference to FIGS. 10 and 11. FIG. 10 shows an equivalent circuit including the photoelectric conversion element and the switching TFT for one pixel, and FIG. 11 is a timing chart showing the operation of this circuit. In order to refresh the photoelectric conversion element 401, a gate Vg (730) and a reset switching element 705 are turned on while a bias power supply 701 is set to have a given voltage value (Vr). With this operation, the D electrode of the photoelectric conversion element 401 is refreshed to Vr, and its G electrode is refreshed to a bias $V_{BT}$ of a reset power supply 707 ($Vr<V_{BT}$). After this operation., the photoelectric conversion element is set in a storage state (reading mode). Thereafter, the X-ray source 901 is turned on, and X-rays passing through the human body and the grid 903 are irradiated onto the scintillator 904. Fluorescence produced by the scintillator 904 is irradiated onto the photoelectric conversion element 401 and is photoelectrically converted. Since the a-SiN$_x$ insulating layer and the a-Si:H photoelectric conversion semiconductor layer that constitute the photoelectric conversion element are also dielectrics, the photoelectric conversion element also serves as a capacitive element. That is, a signal charge photoelectrically converted by the photoelectric conversion element is stored in the photoelectric conversion element. Thereafter, the gate Vg of the TFT is turned on, and the signal charge in the photoelectric conversion element is transferred to a capacitive element 713. The capacitive element 713 is not formed as a specific element in FIG. 5, and is inevitably formed by the capacitance between the upper and lower electrodes of the TFT, the cross portion 430 between the signal line 409 and the gate line 408, or the like. Of course, the element 713 may be formed as a specific element in correspondence with the design. The above-mentioned operations are performed by an amorphous device formed on the insulating substrate except for power supply and gate control of the TFT. Thereafter, the signal charge in the capacitive element 713 is transferred to a capacitive element 720 in a processing circuit by a switching element 725, and a signal is output via an operational amplifier 721. Thereafter, the capacitive element 720 is reset by a switch 722, and the capacitive element 713 is reset by a switch 705, thus completing the operation for one pixel.

An example of the operation of the X-ray image pickup device portion of the present invention will be described below with reference to FIGS. 8 and 9.

Shift registers SR1 and SR2 apply Hi-level pulses to control lines g1 to g3 and s1 to s3. Then, the transfer switching TFTs T11 to T33 are electrically connected to switches M1 to M3, and the G electrodes of all the photoelectric conversion elements S11 to S33 are set at the GND potential (since the input terminal of an integration detector Amp is designed to have the GND potential). At the same time, the refresh control circuit RF outputs a Hi-level pulse to turn on the switch SWr, and the D electrodes of all the photoelectric conversion elements S11 to S33 are set to be a positive potential by the refresh power supply Vr. Then, all the photoelectric conversion elements S11 to S33 are set in the refresh mode and are refreshed. At the next timing, the refresh control circuit RF outputs a Lo-level pulse to turn on the switch SWs, and the D electrodes of all the photoelectric conversion elements S11 to S33 are set to be a positive potential by the reading power supply Vs. All the photoelectric conversion elements S11 to S33 are then set in the photoelectric conversion mode. In this state, the shift registers SR1 and SR2 apply Lo-level pulses to the control lines g1 to g3 and s1 to s3. In response to these pulses, the switches M1 to M3 of the transfer switching TFTs T11 to T33 are turned off, and the respective photoelectric conversion elements hold potentials therein although they are open in DC term since they also serve as capacitors. At this time, since no X-rays are incident, no light enters the photoelectric conversion elements S11 to S33, and no photocurrent flows. In this state, when X-ray pulses are output, and pass through the scintillator, fluorescence from the scintillator is incident on the photoelectric conversion elements S11 to S33. This fluorescence contains information concerning the internal structure of a human body. Photocurrents that flow in response to the incident light are stored as charges in the photoelectric conversion elements, and the charges are held after the end of incidence of X-rays. Then, when the shift register SR1 applies a Hi-level control pulse to the control line g1, and the shift register SR2 applies control pulses to the control lines s1 to s3, outputs v1 to v3 are sequentially output via the transfer switching TFTs T11 to T13 and the switches M1 to M3. Similarly, other optical signals are sequentially output under the control of the shift registers SR1 and SR2. With these signals, two-dimensional information of the internal structure of, e.g., a human body are obtained as the outputs v1 to v9. A still image is obtained by the operations described so far. However, when a moving image is to be obtained, the operations described so far are repeated.

In this case, since the D electrodes of the photoelectric conversion elements are connected to a common wiring line, and this common wiring line is controlled to the potentials of the refresh power supply Vr and the reading power supply Vr via the switches SWr and SWs, all the photoelectric conversion elements can be simultaneously switched to the refresh mode or the photoelectric conversion mode. In this manner, an optical output can be obtained using one TFT per pixel without requiring any complicated control.

In FIG. 8, nine pixels are two-dimensionally arranged in a 3×3 matrix, and the outputs from three pixels are concurrently transferred and output in three operations. However, the present invention is not limited to this arrangement. For example, when 5×5 pixels per $mm^2$ are two-dimensionally arranged as 2,000×2,000 pixels, a 40 cm×40 cm X-ray detector can be obtained. When this detector is combined with an X-ray generator in place of an X-ray film to constitute an X-ray image pickup apparatus, it can be used in X-ray chest examination and breast cancer examination. With this arrangement, unlike a film, the output from the apparatus can be instantaneously displayed on a CRT. Furthermore, the output from the apparatus can be converted into digital data, and the digital data can be subjected to image processing to be converted into a desired output. Also, the digital data can be saved in a magneto-optical disk, and previous images can be instantaneously retrieved. Also, the sensitivity is higher than that of a film, and a clear image can be obtained using very weak X-rays that have little influence on the human body.

Figure 12:
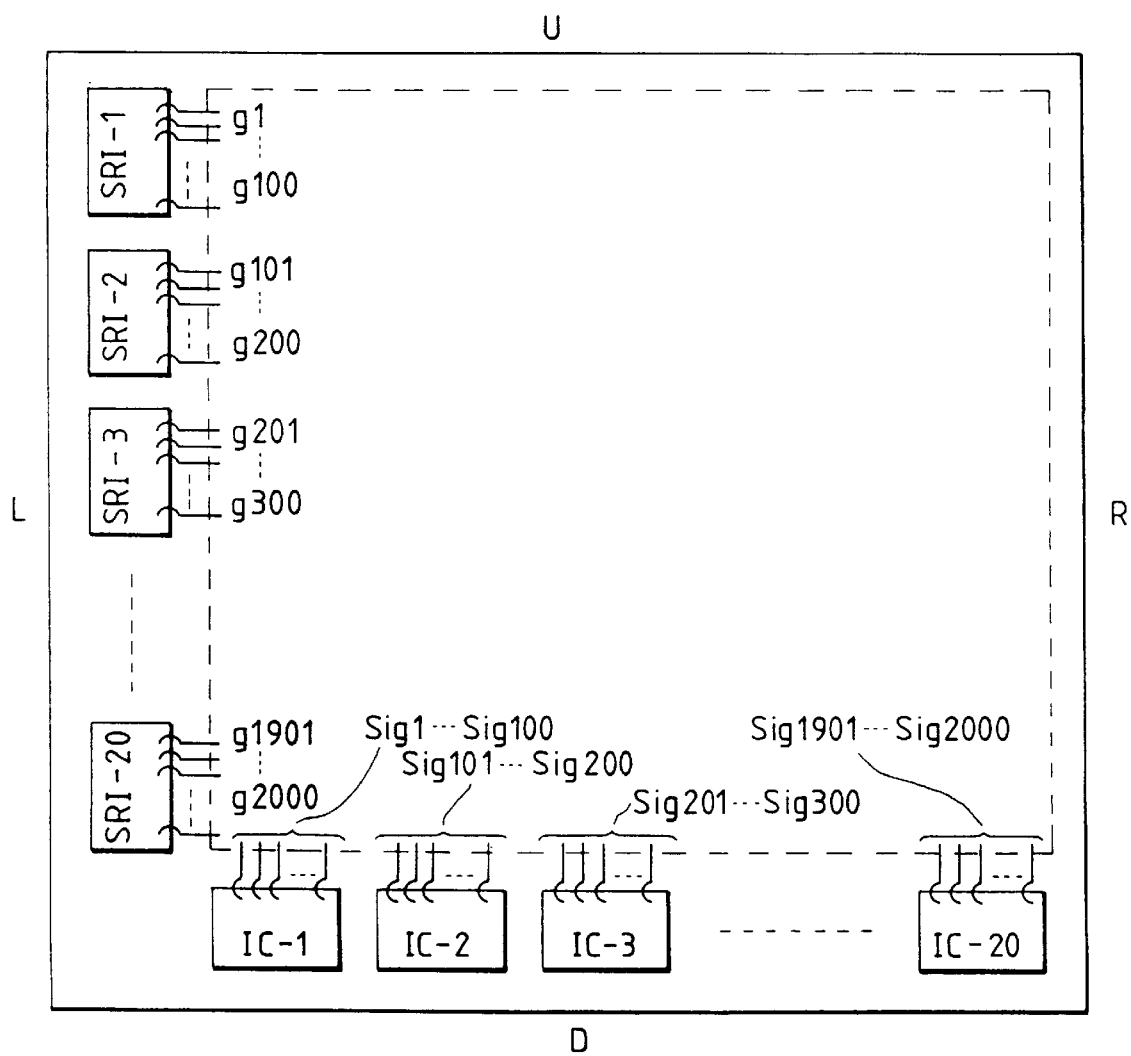
FIGS. 12 and 13 are plan views for explaining the packaging concept of an X-ray detector.
Figure 13:
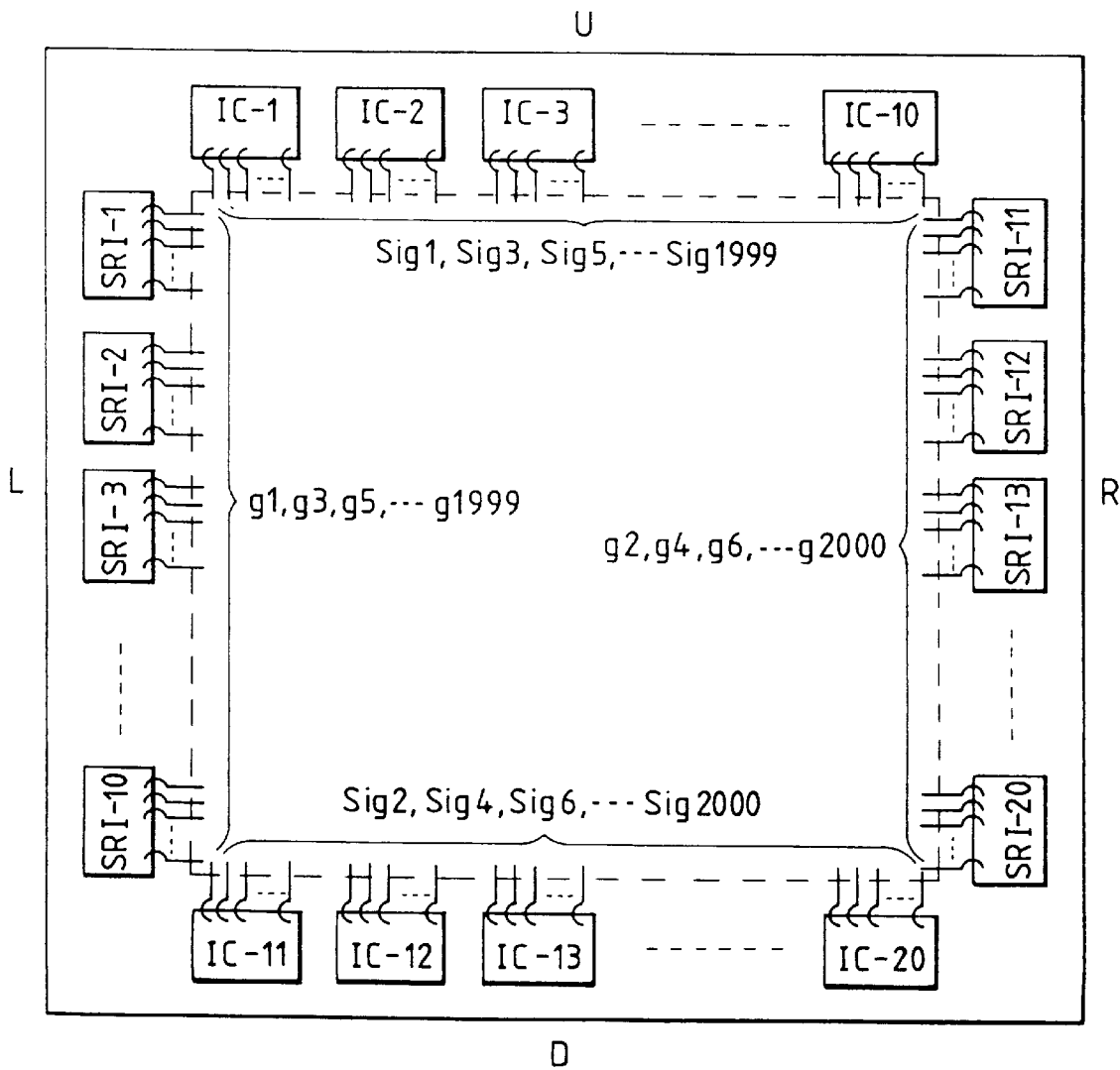

FIG. 12 or 13 shows the packaging state of a detector having 2,000×2,000 pixels. When the detector with 2,000× 2,000 pixels is to be constituted, the number of elements enclosed in a broken line in FIG. 8 can be increased two-dimensionally. In this case, 2,000 control lines g1 to g2000, and 2,000 signal lines sig1 to sig2000 are required. Also, the shift register SR1 and the detection integrated circuit IC have a large scale since they must control and process 2,000 lines. When such elements are realized using one-chip elements, one chip becomes very large, and is disadvantageous in terms of the yield, cost, and the like in the manufacture. In view of this problem, for example, the shift register SR1 is formed as one chip every 100 stages, i.e., 20 chips (SR1-1 to SR1-20) can be used. Also, the detection integrated circuit is formed as one chip for every 100 processing circuits, i.e., 20 chips (IC1 to IC20) can be used.

In FIG. 12, 20 chips (SR1-1 to SR1-20) are mounted on the left side (L), 20 chips are mounted on the lower side (D), and 100 control lines and 100 signal lines per chip are connected by wire bonding. A broken line portion in FIG. 12 corresponds to that in FIG. 8. Also, external connection lines are not shown. Furthermore, the switches SWr and SWs, the power supplies Vr and Vs, the circuit RF, and the like are not shown. The detection integrated circuits IC1 to IC20 generate 20 outputs (Vout). These outputs may be combined into one output via switches, or may be directly output and subjected to parallel processing.

FIG. 13 shows another arrangement. In this arrangement, 10 chips (SR1-1 to SR1-10) are mounted on the left side (L), another 10 chips (SR1-11 to SR1-20) are mounted on the right side (R), 10 chips (IC1 to IC10) are mounted on the upper side (U), and another 10 chips (IC1 to IC20) are mounted on the lower side (D). In this arrangement, since 1,000 wiring lines are distributed to each of the upper, lower, left, and right sides (U, D, L, R), the wiring line density of each side becomes low, and the wire bonding density of each side also becomes low, thus improving the yield. The wiring lines are distributed in such a manner that lines g1, g3, g5, . . . , g1999 are distributed to the left side (L), and lines g2, g4, g6, . . . , g2000 are distributed to the right side (R), i.e., the odd-numbered control lines are distributed to the left side (L), and the even-numbered control lines are distributed to the right side (R). With this arrangement, since the wiring lines are extended at equal intervals, the yield can be improved without too high a local density. The same applies to the distribution of wiring lines to the upper and lower sides (U, D).

Although not shown, as still another arrangement, the wiring lines may be distributed as follows. That is, lines g1 to g100, g201 to g300, . . . , g1801 to g1900 are distributed to the left side (L), and lines g101 to g200, g301 to g400, . . . , g1901 to g2000 are distributed to the right side (R), i.e., successive control lines in units of chips are alternately distributed to the left and right sides (L, R). With this arrangement, since control lines in one chip can be successively controlled, the driving timings can be determined easily, and the circuit arrangement can be prevented from being complicated, thus reducing the cost of the circuit. The same applies to the upper and lower sides (U, D), and a low-cost circuit can be used since continuous processing is allowed.

After the circuit enclosed in the broken line is formed on a single board of both the detectors shown in FIGS. 12 and 13, chips may be mounted on the board, or the circuit board corresponding to the broken line portion and chips may be mounted on another large board. Alternatively, chips may be mounted on a flexible circuit board, and may be adhered and connected to the circuit board corresponding to the broken line portion.

When the above-mentioned arrangement is adopted, the manufacturing process of a large-area photoelectric conversion device with a very large number of pixels can be realized by a simple process including essentially a small number of steps since the respective elements can be simultaneously formed by common films. For this reason, large-area, high-performance photoelectric conversion devices can be manufactured with high yield and low cost.

As can be seen from the above description, the photoelectric conversion element according to the present invention is not limited to the above-mentioned specific one. The photoelectric conversion element need only comprise a first electrode layer, an insulating layer for blocking movement of holes and electrons, a photoelectric conversion semiconductor layer, and a second electrode layer, and an injection blocking layer that blocks injection of holes into the photoelectric conversion semiconductor layer need only be formed between the second electrode layer and the photoelectric conversion semiconductor layer.

In the above description, holes and electrons may be reversed. For example, the injection blocking layer may be a p-layer. In this case, other constituting portions may be arranged while inverting the polarities of the voltages and electric fields to be applied, thus assuring the same operation as described above. Furthermore, the photoelectric conversion semiconductor layer need only have a photoelectric conversion function that generates electron-hole pairs upon incidence of light. Also, the layer arrangement is not limited to a single layer but may adopt a multi-layered structure, or the characteristics may change continuously.

Likewise, the TFT need only comprise a gate electrode, a gate insulating film, a semiconductor layer that can form a channel, an ohmic contact layer, and a main electrode. For example, the ohmic contact layer may be a p-layer, and in this case, the control voltage for the gate electrode may be inverted to use holes as carriers.

Figure 14:
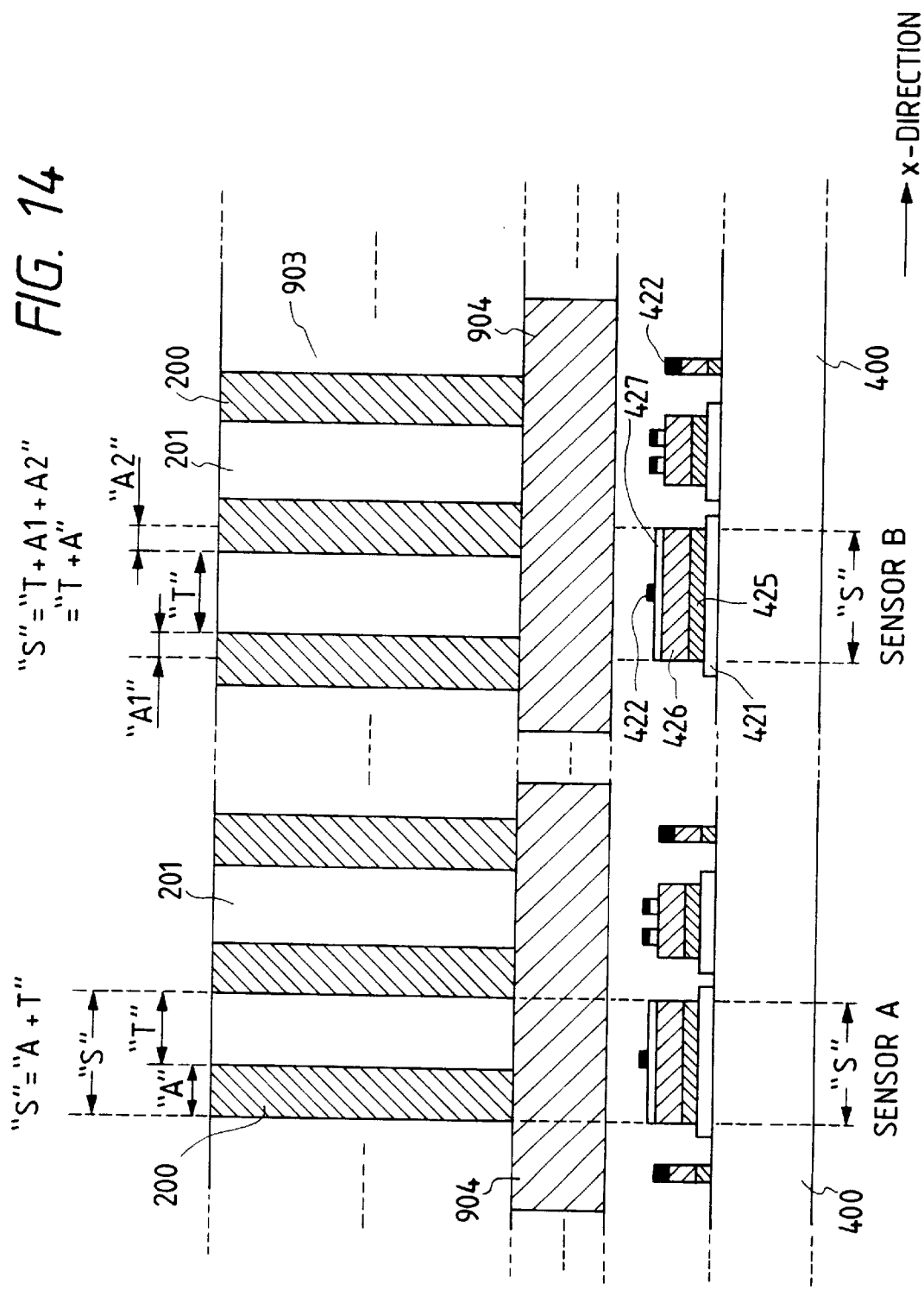

FIG. 14 is a sectional view for explaining in more detail an X-ray image pickup device according to the present invention. The X-ray image pickup device comprises, in the following order from the upper side, a grid 903 consisting of substance portions 200 that absorb X-rays and substance portions 201 that transmit X-rays, a phosphor 904 serving as a wavelength converter for converting X-rays into visible light, and an insulating substrate 400 on which photoelectric conversion elements 401, switching elements 402, a protection layer 403 for protecting them, and the like are formed. The layer arrangement of the photoelectric conversion elements 401 and the switching element 402 is the same as that shown in FIG. 6, and the respective layers are denoted by the same reference numerals as those in FIG. 6. Note that the photoelectric conversion device portions (401, 402, and other wiring lines) in FIG. 14 do not show geometrically successive two bits (adjacent two bits) unlike in FIG. 6, but show arbitrarily selected two bits. As shown in FIG. 14, these two bits will be referred to as sensors A and B hereinafter. The light-receiving areas of these sensors are indicated by "S" in FIG. 14. Also, the sizes of the substance portion 200 that absorbs X-rays and the substance portion 201 that transmits X-rays are respectively indicated by "A" and "T", and the sum, "A+T", of these sizes "A" and "T" is assumed to be the grid pitch. Note that these sizes ("S", "A", "T") are considered in the direction of grid pitch (one-dimensional direction: X-direction in FIG. 14).

Referring to FIG. 14, the size "S" of the light-receiving area of the sensor is equal to the grid pitch ("A+T"). The light-receiving area of sensor A (the left sensor in FIG. 14) is in phase with the grid; it is seen that the relationship "S"="A+T" holds. In sensor A, X-rays transmitted through one substance region 201 that transmits X-rays are converted into visible light by the phosphor 904, and only the corresponding light amount is photoelectrically converted by sensor A. On the other hand, in sensor B, as shown in FIG. 14, the phase relationship between the light-receiving area and the grid is not always the same as that of sensor A. This is because the pitch ("$S_P$") of the sensor (photoelectric conversion elements) is not equal to the grid pitch.

Normally, when the grid pitch is different from the sensor pitch, even when uniform light is irradiated, an output distribution is generated due to a difference in space phase, and a periodic density pattern is formed on the image. Generally, this phenomenon is called "moiré". When moire has been generated, the image quality obtained by the X-ray image pickup device considerably deteriorates.

However, since the light-receiving area size "S" of sensor B in FIG. 14 is equal to the grid pitch "A+T", the light amount photoelectrically converted by sensor B is equal to the fluorescence amount generated by X-rays that are transmitted through only one X-ray transmission substance region 201 (on sensor B, "S"="T+A1+A2").

More specifically, when the light-receiving area size "S" of the photoelectric conversion element equals the grid pitch "T+A", every photoelectric conversion element can generate equal photoelectric conversion outputs independently of the phase relationship of the grid (200 and 201) on each photoelectric conversion element.

Figure 15:
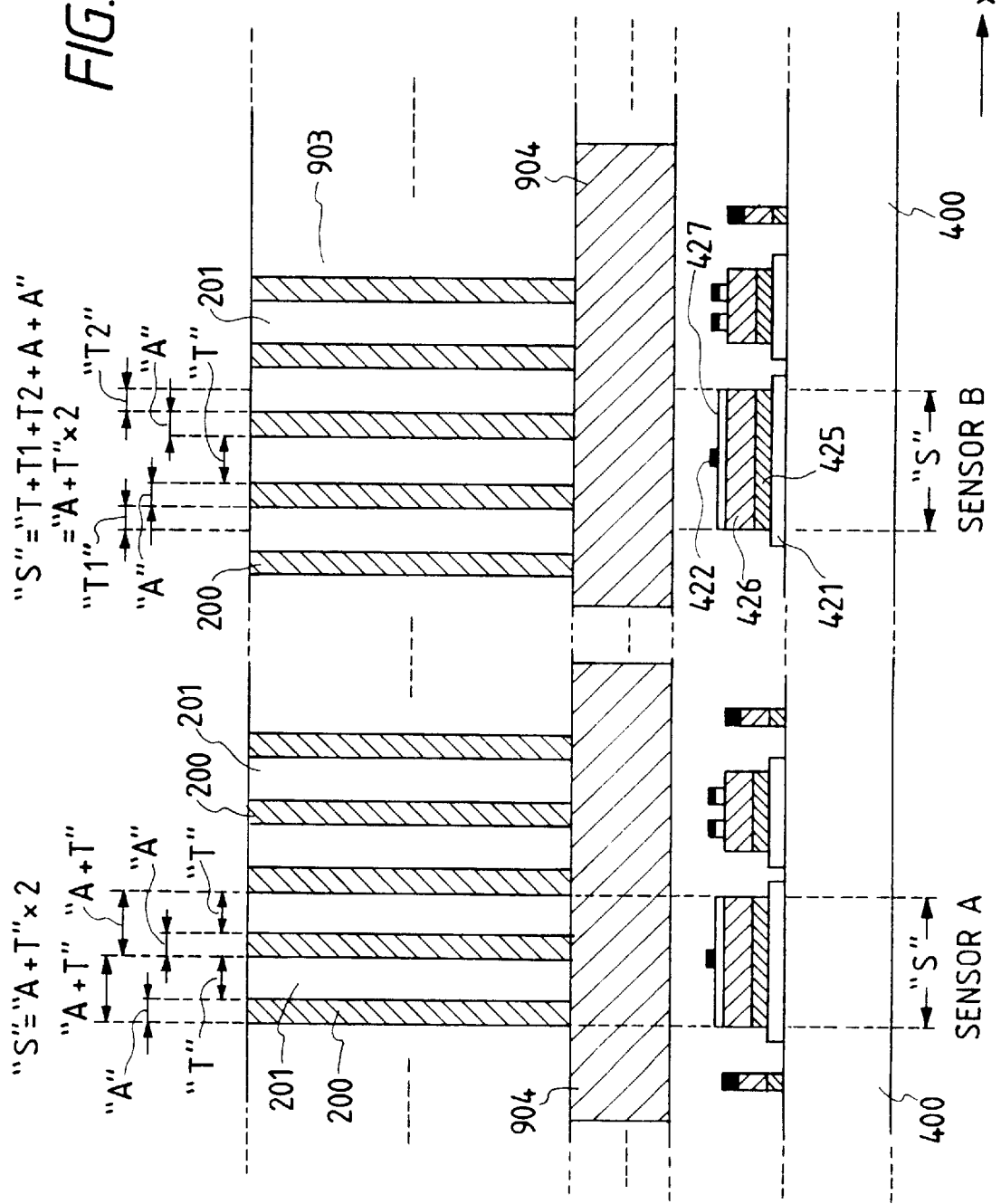

FIG. 15 shows a case wherein the light-receiving area size "S" of the photoelectric conversion element is equal to a value twice the grid pitch "T+A" ("S"="T+A"*2). On both sensors A and B (irrespective of the sensor position), fluorescence produced by X-rays that are transmitted through two X-ray transmission substance regions 201 in the grid is photoelectrically converted, and a photoelectric conversion output independent from the positional relationship of the grid with respect to the light-receiving surface size "S" can be obtained, thus obtaining the same effect as the device shown in FIG. 14. Although not shown, the same applies to "S"="T+A"*N (N: an integer equal to or larger than 3).

In FIGS. 14 and 15, the grid pitch has been described in only one direction taking as an example the sectional views of the X-ray image pickup device of the present invention. In other words, an example using the grid shown in FIG. 2 has been described, and the effect of the present invention in this case is limited to a one-dimensional region, needless to say. However, since the present invention relates to a two-dimensional X-ray image-pickup device, a grid having a checkerboard-like pattern obtained by arranging X-ray absorption substance portions 200 and X-ray transmission substance portions 201 in a two-dimensional region is used, as a matter of course, and the grid pitches ("$T_X+A_X$", "$T_Y+A_Y$") in the x- and y-directions are set to be equal to an integer multiple of the corresponding sizes ($S_X$, $S_Y$) of the light-receiving surfaces of the photoelectric conversion elements in the X- and Y-directions, i.e.,:

"$S_X$"="$T_X+A_X$"*$N_X$ ($N_X$: positive integer)

"$S_Y$"="$T_Y+A_Y$"*$N_Y$ ($N_Y$: positive integer)

With this arrangement, the effect of the present invention can be expected in both the x- and y-directions, needless to say.

Figure 16:
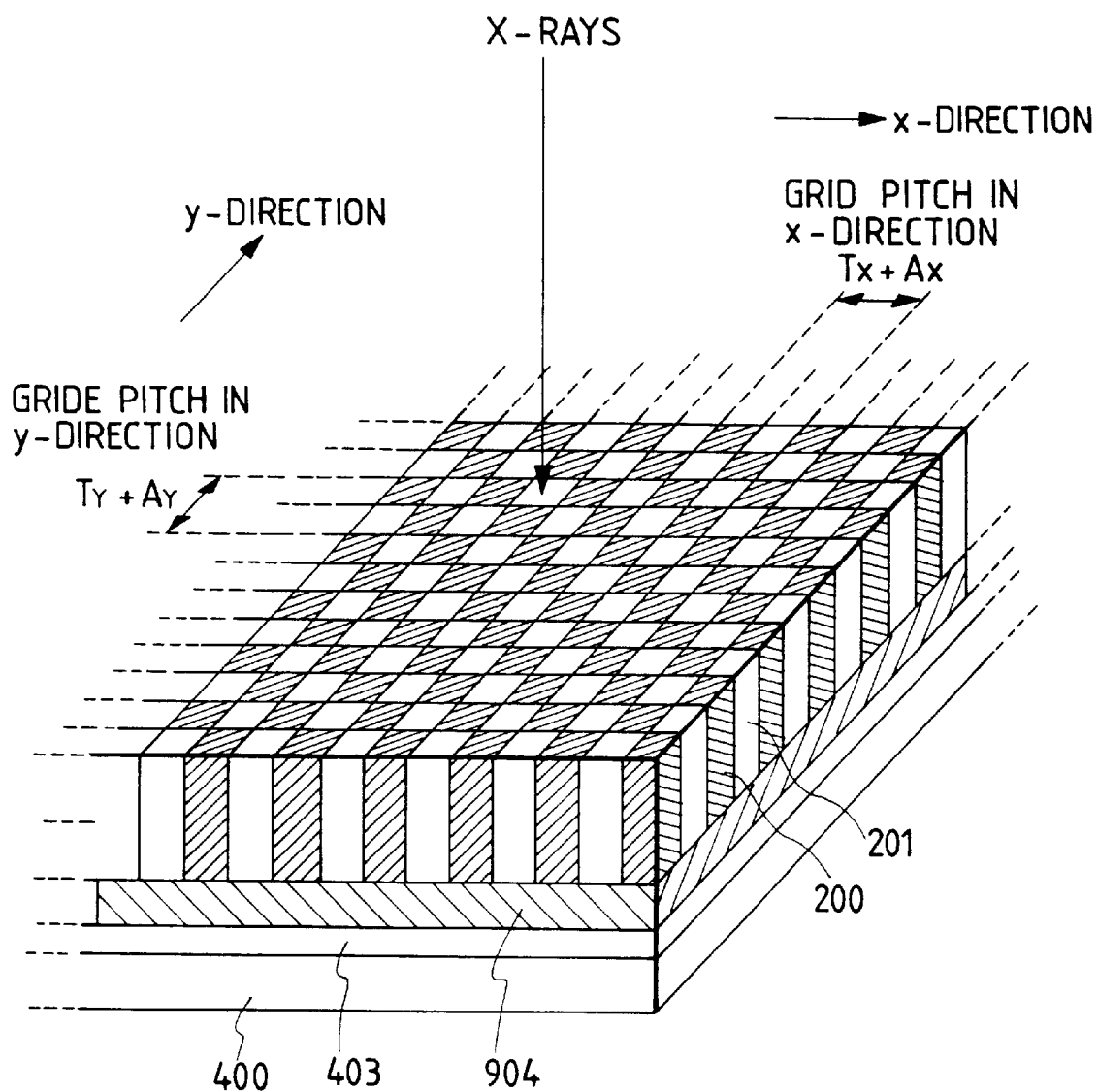
FIG. 16 is a perspective view for explaining a preferred embodiment of an X-ray image pickup device of the present invention.

FIG. 16 is a schematic perspective view showing such X-ray image pickup device (photoelectric conversion element portions are not shown).

Figure 17:
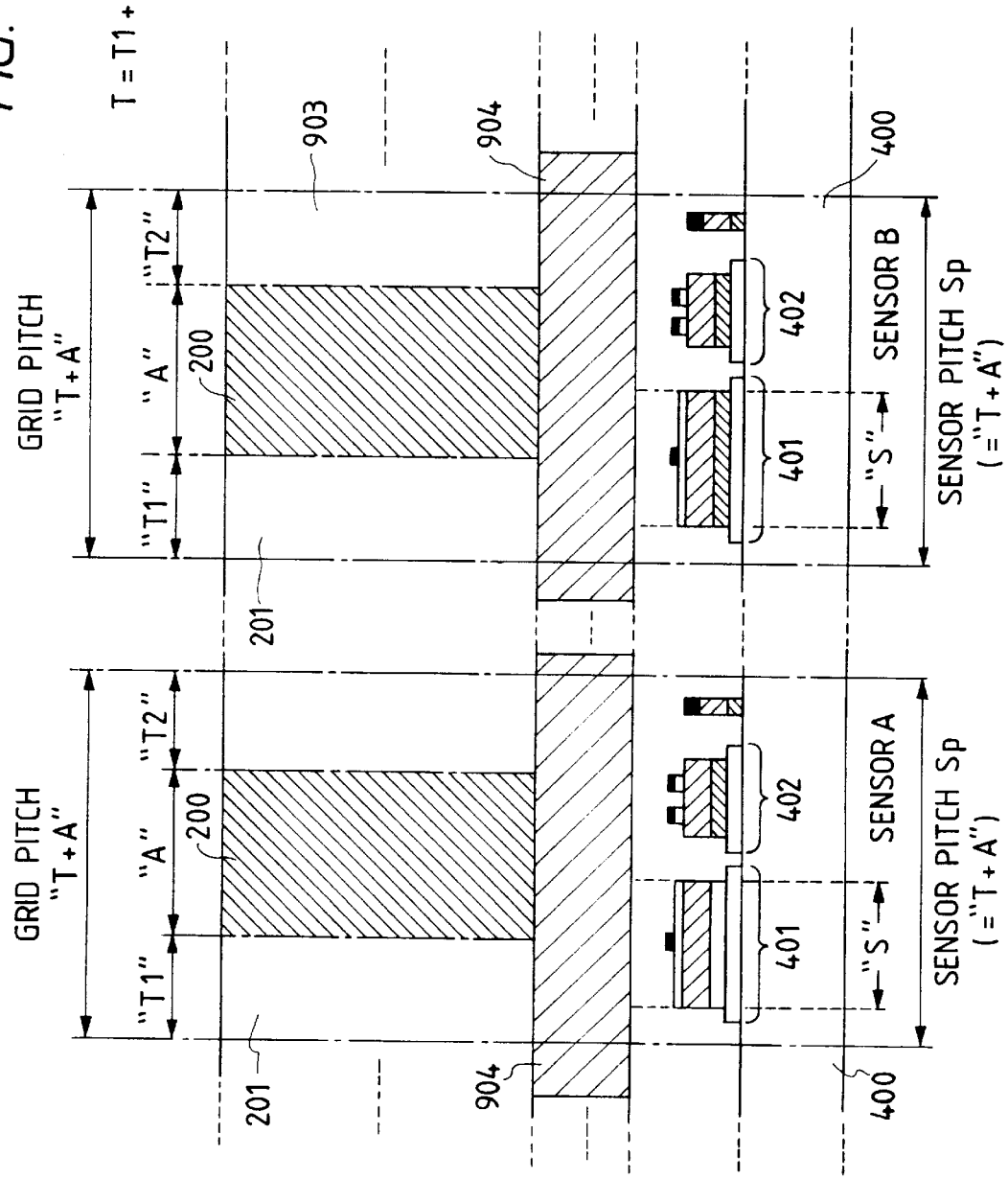

FIGS. 17 and 18 are respectively sectional views of an X-ray image pickup device of the present invention. The same reference numerals in FIGS. 17 and 18 denote the same parts as in FIG. 14.

FIG. 17 shows a case wherein sensors A and B have photoelectric conversion elements with the same arrangement, the pitch of the grid (200, 201) is equal to the sensor pitch "Sp", and the positional relationship between the grid and sensors varies. As can be seen from FIG. 17, as the sensor light-receiving surface is located in the shadow portion of the X-ray absorption substance portion 200 that constitutes the grid, it cannot obtain a maximum light amount of the sensor. However, since the grid pitch is equal to the sensor pitch, no moire is generated. Since the grid is used, X-rays scattered inside the human body can be removed, as a matter of course. That is, with this layout, very high image quality can be obtained while preventing a density pattern or stripe pattern which is not present in the object from appearing on the X-ray image.

In FIG. 18, the grid pitch ("T+A") is equal to the sensor pitch ("Sp"), and the space positional relationship between the grid and sensors is determined so that the light-receiving surfaces of sensors A and B are located immediately under the X-ray transmission substance portions 201 that constitute the grid. With this positional relationship, the amount of light received by the sensor light-receiving surface is maximized. That is, the signal output of the X-ray image pickup device can be maximized, and a high S/N ratio can be obtained. That is, an X-ray image pickup device having higher image quality than that of the device shown in FIG. 17 can be provided.

In FIGS. 17 and 18, the positional relationship between the sensor and the grid has been described in only one direction using the sectional views of an X-ray image pickup device when the sensor pitch ("Sp") equals the grid pitch ("T+A"). However, as has also been described in FIG. 16, this relationship is not limited in the one-dimensional structure. That is, a grid having a checkerboard-like pattern obtained by arranging X-ray absorption substance portions 200 and X-ray transmission substance portions 201 in a two-dimensional region is used, and the grid pitches ("Tx+Ax", "Ty+Ay") in the x- and y-directions are set to be equal to an integer multiple of the corresponding sizes (Spx, Spy) of the photoelectric conversion elements in the X- and Y-directions, i.e.,:

"$Spx$"="$Tx+Ax$"

"$Spy$"="$Ty+Ay$"

Also, when the space phase relationship is determined to maximize the light amount on the sensor light-receiving surface, as shown in FIG. 15, and is applied two-dimensionally, the same effect can be expected in both the x- and Y-directions.

Furthermore, when this relationship is expanded as follows, the same effect can be expected, as a matter of course:

"$Spx$"="$Tx+Ax$"*$Nx$ (Nx: positive integer)

"$Spy$"="$Ty+Ay$"*$Ny$ (Ny: positive integer)

The above-mentioned grid may be inclined to point in the direction of the light source (often, a point light source), as shown in FIG. 3. In this case, the relationship between the pitch of the photoelectric conversion elements and the grid pitch can be adjusted on the photoelectric conversion element side of the grid. With this arrangement, a high-sensitivity X-ray image pickup device can be realized, and the radiation amount onto a human body or the like can be reduced.

The wavelength converter such as a phosphor and the grid may be coupled using an adhesive or a mechanical fixing means. When a mechanical fixing means is used, the detectors having the photoelectric conversion elements, the wavelength converter, and the grid may be housed in and fixed to a single housing. In the case of mechanical fixing, even when the wavelength converter such as a phosphor, other constituting members, and the like deteriorate or fail, only a required one can be exchanged. The fixing using an adhesive is disadvantageous in terms of exchange, but the relative positional relationship never deviates once the members are fixed, thus improving the vibration resistance.

However, the present invention can be applied to either fixing method, needless to say.

As described above, according to the present invention, since the two-dimensional image reading device is substantially in tight contact with the X-ray-visible light conversion phosphor, the size of the X-ray image pickup device can be greatly reduced since the need for any reduction optical system including a lens can be obviated, and a device with a high S/N ratio can be provided since fluorescence from the X-ray-visible light conversion phosphor can be effectively used. Since the device comprises the grid, X-ray components scattered in an object such as a human body can be removed, and an X-ray image with high resolution and high image quality can be obtained. Since no film is used, the output from the photoelectric conversion element, i.e., X-ray image data can be processed as a digital value without any time lag and another reading processing, and can be easily subjected to high-speed data processing if a versatile hardware arrangement or software program is used.

Since the size of the light-receiving surface of the photoelectric conversion element is set to be equal to the grid pitch or a value N times (N: an integer equal to or larger than 2) of the grid pitch, generation of moire due to a space phase shift can be prevented irrespective of the positional relationship between the two-dimensional image reading device and the grid, and an X-ray image pickup device with high image quality can be provided. In addition, when the positional relationship between the two-dimensional image reading device and the grid can be freely determined, the manufacturing cost can be reduced since delicate positional adjustment in the manufacture need not be performed. In addition, a highly reliable device which can be used even in an environment with many vibrations such as a medical examination vehicle that mounts an X-ray image pickup apparatus, can be provided.

When the pitch of the photoelectric conversion elements is set to be equal to a value N times (N: an integer equal to or larger than 1) of the grid pitch, and in this case, the positional relationship between the photoelectric conversion elements and grid is determined to maximize the signal outputs from the photoelectric conversion elements, the S/N ratio of the X-ray image pickup device can be increased, and diagnostic precision can be improved.

When the photoelectric conversion element is constituted by, from the insulating substrate side, a first metal thin film serving as a lower electrode, an amorphous silicon nitride insulating layer (a-SiN$_x$) that can block passage of electrons and holes, a hydrogenated amorphous silicon photoelectric conversion layer (a-Si:H), an n-type injection blocking layer that blocks injection of hole carriers or a p-type injection blocking layer that blocks injection of electron carriers, and a transparent conductive layer or a second metal thin film layer formed on a portion of the injection blocking layer, which serves as an upper electrode, an existing thin film manufacturing device such as a CVD device, a sputtering device, or the like can be used, and a large-area X-ray image pickup device can be provided.

According to the present invention, the diagnostic efficiency can be greatly improved in hospitals unlike in the conventional method, and a diagnostic information network can be constructed covering the entire nation, thus improving the diagnostic efficiency in the whole medical field.

Note that the X-ray image pickup device of the present invention is not limited to the above-mentioned example, and various modifications and combinations may be made within the spirit and scope of the invention.

What is claimed is:

1. An X-ray image pickup method for use with an X-ray source for generating an X-ray;
    a two-dimensional image reading device constituted by two-dimensionally forming a plurality of photoelectric conversion elements on an insulating substrate;
    a wavelength converter which is formed to be substantially in tight contact with a surface of said two-dimensional image reading device and converts a wavelength of irradiated X-ray into a wavelength in a photosensitive wavelength range of said two-dimensional image reading device; and
    a grid plate comprising X-ray transmission material and material for limiting X-ray transmission arranged alternately in a pitch smaller than that of said photoelectric conversion elements, a width of a photoreceiving area of said photoelectric conversion element being equal to or an integer multiple of a grid pitch which is a width formed by a set of the X-ray transmission material and the material for limiting X-ray transmission, thereby guiding X-rays from a specific direction toward said wavelength converter, said method comprising:
    (a) arranging an object so that said grid plate is positioned between said wavelength converter and said X-ray source and at a side of said object in opposition to said wavelength converter;
    (b) generating X-rays from said X-ray source;
    (c) converting the X-rays transmitted through said object according to a quantity of the X-ray transmitted through the object with said wavelength convertor; and
    (d) photoelectrically converting a light signal according to the quantity of the transmitted X-ray subjected to the wavelength conversion by said photoelectric according to the X-ray transmission image of the object.

2. An X-ray image pickup method according to claim 1, including arranging the section of the X-ray transmission material and the material for limiting the X-ray transmission in a checkerboard pattern.

3. An X-ray image pickup method according to claim 1, including providing the electric signal after termination of the X-ray irradiation from said X-ray source.

4. An X-ray image pickup method according to claim 1, wherein the material for limiting the X-ray transmission includes lead.

5. An X-ray image pickup method according to claim 1, wherein the X-ray transmission material includes aluminum.

6. An X-ray image pickup method according to claim 1, wherein each section of the X-ray transmission material and the material for limiting the X-ray transmission has a sectional area shape inclined from a plane of a side of said two-dimensional image reading device at least in a thickness direction.

7. An X-ray image pickup method according to claim 1, including arranging the sections of the X-ray transmission material and the material for limiting the X-ray transmission of said grid such that a sectional area thereof is in a long X-ray emitting direction from said X-ray source.

8. An X-ray image pickup method according to claim 1, including forming the X-ray transmitting material section (i) of said grid and the material section (ii) for limiting the X-ray transmission into a strip shape, and arranging said sections (i) and (ii) in parallel to one column of said photoelectric conversion elements arranged two dimensionally.

9. An X-ray image pickup method according to claim 1, wherein said two-dimensional image reading device is formed by (a) arranging said photoelectric conversion elements operating as pixels per a predetermined sensor pitch in X and X-directions; (b) providing as said grid plate a combination of a material section of the X-ray transmitting material and a material section of absorbing X-ray which is the material for limiting X-ray transmission, in the predetermined grid pitch in at least one of X and Y-direction; and (c) employing a photoreceiving surface of the photoelectric conversion element of a size such that the grid pitch direction is equal to the pitch of the grid plate or is N times longer than the pitch of said grid plate, wherein N is integer not less than 2.

10. An X-ray image pickup method according to claim 1, wherein
    said two-dimensional image reading device is constituted by arranging said photoelectric conversion elements operating as pixels in a predetermined interval or sensor pitch in X and Y directions, said grid plate comprising a section (A) of the X-ray transmission material and a section (B) of transmitting X-ray of a material limiting the X-ray transmission in a predetermined pitch or grid pitch in at least one of X and Y-direction, and the sensor pitch equals to the grid pitch or is N times greater than the grid pitch, wherein N is integer not less than 2.

11. An X-ray image pickup method according to claim 10, including setting a relation between positions of said two-dimensional image reading device and said grid plate such that said X-ray transmission material section is positioned to maximize an output from said photoelectric conversion elements.

12. An X-ray image pickup method according to claim 1, including employing as each of said photoelectric conversion elements (a) a first metal thin film layer operating as a lower electrode provided at side of said insulating substrate, (b) an insulating layer for blocking a passage of electrons and holes, (c) a hydrogenated amorphous silicon photoconductive layer, (d) a blocking layer selected from the group consisting of a p-type injection blocking layer for blocking electron carrier injection and a n-type injection blocking layer for blocking an injection of a hole carrier, and (e) an upper electrode formed at least on a part of said injection blocking layer, wherein said upper electrode is selected from the group consisting of a second metal thin film and a transparent conductive layer.

13. An X-ray image pickup method for use with an X-ray source for generating an X-ray;

a two-dimensional image reading device constituted by two-dimensionally forming a plurality of photoelectric conversion elements on an insulating substrate;

a wavelength converter which is formed to be substantially in tight contact with a surface of said two dimensional image reading device and converts a wavelength of irradiated X-rays into a wavelength in a photosensitive wavelength range of said two-dimensional image reading device; and a grid plate comprising rows of X-ray transmission material and rows of material for limiting X-ray transmission arranged alternately in a pitch so that the arrangement pitch of a width of one unit pitch including one row of the X-ray transmission material and one row of the material for limiting X-ray transmission is smaller than that of said photoelectric conversion elements, thereby guiding X-rays from a specific direction toward said wavelength converter, said method comprising:

(a) arranging an object so that said grid plate is positioned between said wavelength converter and said X-ray source and at a side of said object in opposition to said wavelength converter;

(b) generating X-rays from said X-ray source;

(c) converting the X-rays transmitted through said object according to a quantity of the X-ray transmitted through the object with said wavelength convertor; and (d) photoelectrically converting a light signal according to the quantity of the transmitted X-ray subjected to the wavelength conversion by said photoelectric conversion elements, thereby providing an electric signal according to the x-ray transmission image of the object.

14. An X-ray image pickup method according to claim 13, including providing the electric signal after termination of the X-ray irradiation from said X-ray source.

15. An X-ray image pickup method according to claim 13, wherein the material Ear limiting the X-ray transmission includes lead.

16. An X-ray image pickup method according to claim 13, wherein the X-ray transmission material includes aluminum.

17. An X-ray image pickup method according to claim 13, wherein each section of the X-ray transmission material and the material for limiting the X-ray transmission has a sectional area shape inclined from a plane of a side of said two-dimensional image reading device at least in a thickness direction.

18. An X-ray image pickup method according to claim 13, including arranging the sections of the X-ray transmission material and the material for limiting the X-ray transmission of said grid such that a sectional area thereby is in a long X-ray emitting direction from said X-ray source.

19. An X-ray image pickup method according to claim 13, including forming the X-ray transmitting material section (i) of said grid and the material section (ii) for limiting the X-ray transmission into a strip shape, and arranging said sections (i) and (ii) in parallel to one column of said photoelectric conversion elements arranged two dimensionally.

20. An X-ray image pickup method according to claim 13, including employing as each of said photoelectric conversion elements (a) a first metal thin film layer operating as a lower electrode provided at side of said insulating substrate, (b) an insulating layer for blocking a passage of electrons and holes, (c) a hydrogenated amorphous silicon photoconductive layer, (d) a blocking layer selected from the group consisting of a p-type injection blocking layer for blocking electron carrier injection and a n-type injection blocking layer for blocking an injection of a hole carrier, and (e) an upper electrode formed at least on a part of said injection blocking layer, wherein said upper electrode is selected from the group consisting of a second metal thin film and a transparent conductive layer.

21. An X-ray image pickup method according to claim 13, wherein said two-dimensional image reading device is formed by (a) arranging said photoelectric conversion elements operating as pixels per a predetermined sensor pitch in X and X-directions; (b) providing as said grid plate a combination of a material section of the X-ray transmitting material and a material section of absorbing X-ray which is the material for limiting X-ray transmission, in the predetermined grid pitch in at least one of X and Y-direction; and (c) employing a photoreceiving surface of the photoelectric conversion element of a size such that the grid pitch direction is equal to the pitch of the grid plate or is N times longer than the pitch of said grid plate, wherein N is integer not less than 2.

22. An X-ray image pickup method according to claim 13, wherein said two-dimensional image reading device is constituted by arranging said photoelectric conversion elements operating as pixels in a predetermined interval or sensor pitch in X and Y directions, said grid plate comprising a section (A) of the X-ray transmission material and a section (B) of transmitting X-ray of a material limiting the X-ray transmission in a predetermined pitch or grid pitch in at least one of X and Y-direction, and the sensor pitch equals to the grid pitch or is N times greater than the grid pitch, wherein N is integer not less than 2.

23. An X-ray image pickup method according to claim 22, including setting a relation between positions of said two-dimensional image reading device and said grid plate such that said X-ray transmission material section is positioned to maximize an output from said photoelectric conversion elements.

* * * * *

UNITED STATES PATENT AND TRADEMARK OFFICE
CERTIFICATE OF CORRECTION

PATENT NO. : 6,118,851
DATED : December 11, 2000
INVENTOR(S) : TADAO ENDO ET AL.

Page 1 of 3

It is certified that error appears in the above-identified patent and that said Letters Patent is hereby corrected as shown below:

COLUMN 1

Line 13, "in" should be deleted.

COLUMN 2

Line 11, "the hospital" should read --hospitals--.

COLUMN 3

Line 13, "is" should be deleted.

COLUMN 16

Line 2, "x" should read --X--.

UNITED STATES PATENT AND TRADEMARK OFFICE
CERTIFICATE OF CORRECTION

PATENT NO.    : 6,118,851
DATED         : December 11, 2000
INVENTOR(S)   : TADAO ENDO ET AL.

It is certified that error appears in the above-identified patent and that said Letters Patent is hereby corrected as shown below:

COLUMN 17

Line 65, "photoelectric" should read --photoelectric conversion elements--.

COLUMN 18

Line 34, "X-directions;" should read --Y-directions;--; and
Line 67, "at" should read --at a--.

COLUMN 19

Line 5, "a" should read --an--; and
Line 50, "Ear" should read --for--.

UNITED STATES PATENT AND TRADEMARK OFFICE
CERTIFICATE OF CORRECTION

PATENT NO. : 6,118,851

DATED : December 11, 2000

INVENTOR(S) : TADAO ENDO ET AL.

It is certified that error appears in the above-identified patent and that said Letters Patent is hereby corrected as shown below:

COLUMN 20

Line 14, "at" should read --at a--;
Line 19, "a" should read --an--; and
Line 30, "X-directions;" should read --Y-directions;--.

Signed and Sealed this

Twenty-ninth Day of May, 2001

Attest:

NICHOLAS P. GODICI

Attesting Officer     Acting Director of the United States Patent and Trademark Office